(12) United States Patent
Park et al.

(10) Patent No.: US 12,057,440 B2
(45) Date of Patent: Aug. 6, 2024

(54) DISPLAY DEVICE INCLUDING COUPLED DISPLAY PANELS

(71) Applicant: Samsung Display Co., LTD., Yongin-si (KR)

(72) Inventors: Saeron Park, Hwaseong-si (KR); Jinsuek Kim, Suwon-si (KR); Seungbo Shim, Asan-si (KR); Hokil Oh, Seoul (KR); Eunggyu Lee, Cheonan-si (KR); Jae-Soo Jang, Suwon-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 373 days.

(21) Appl. No.: 17/396,862

(22) Filed: Aug. 9, 2021

(65) Prior Publication Data

US 2022/0189935 A1   Jun. 16, 2022

(30) Foreign Application Priority Data

Dec. 10, 2020  (KR) .......................... 10-2020-0172360

(51) Int. Cl.
*H10K 50/84* (2023.01)
*H01L 25/10* (2006.01)
(Continued)

(52) U.S. Cl.
CPC ....... *H01L 25/105* (2013.01); *H10K 50/8426* (2023.02); *H10K 50/844* (2023.02);
(Continued)

(58) Field of Classification Search
CPC ............. H10K 50/8426; H10K 50/844; H10K 50/865; H10K 50/85; H10K 50/86; H10K 59/38; H10K 59/18; H10K 59/128; H10K 59/131; G02F 1/13336; G02F 1/133512; G02F 3/1446; G09G 2300/026; G09G 2300/0408

See application file for complete search history.

(56) References Cited

U.S. PATENT DOCUMENTS 5,851,411 A    12/1998  An et al.
6,014,193 A     1/2000  Taira et al.
(Continued)

FOREIGN PATENT DOCUMENTS

| JP | 3131354 B2 | 11/2000 | |
| JP | 2002156652 A | * 5/2002 | ....... H01L 29/78633 |
| JP | 4724892 B2 | 4/2011 | |
| KR | 10-0218580 B1 | 9/1999 | |
| KR | 1020030051617 A | 6/2003 | |
| KR | 1020190062787 A | 6/2019 | |

OTHER PUBLICATIONS

European Search Report for European Patent Application No. 21210948.2 dated Mar. 10, 2022.

*Primary Examiner* — Ida M Soward
(74) *Attorney, Agent, or Firm* — CANTOR COLBURN LLP

(57) ABSTRACT

A display device includes a first display panel, a second display panel, and an optical member. The first display panel includes a first substrate and a first cover member on the first substrate. The second display panel is coupled to a first side of the first display panel, and includes a second substrate and a second cover member on the second substrate. The optical member is in a groove defined by the first and second cover members at a boundary of the first and second display panels.

28 Claims, 15 Drawing Sheets

(51) Int. Cl.
*H10K 50/842* (2023.01)
*H10K 50/844* (2023.01)
*H10K 50/85* (2023.01)
*H10K 50/86* (2023.01)
*H10K 59/12* (2023.01)
*H10K 59/13* (2023.01)
*H10K 59/35* (2023.01)
*H10K 59/38* (2023.01)
*G02F 1/1333* (2006.01)
*G02F 1/1335* (2006.01)
*G06F 3/14* (2006.01)
*G09F 9/302* (2006.01)
*H10K 59/128* (2023.01)
*H10K 59/131* (2023.01)
*H10K 59/18* (2023.01)

(52) U.S. Cl.
CPC ....... *H10K 50/865* (2023.02); *G02F 1/13336* (2013.01); *G02F 1/133512* (2013.01); *G06F 3/1446* (2013.01); *G09F 9/3026* (2013.01); *G09G 2300/026* (2013.01); *H10K 50/85* (2023.02); *H10K 50/86* (2023.02); *H10K 59/128* (2023.02); *H10K 59/131* (2023.02); *H10K 59/18* (2023.02); *H10K 59/35* (2023.02); *H10K 59/38* (2023.02)

(56) References Cited

U.S. PATENT DOCUMENTS

| | | | |
|---|---|---|---|
| 6,057,898 A | 5/2000 | Itoh et al. | |
| 2002/0024808 A1* | 2/2002 | Suehiro | G09F 9/33 362/241 |
| 2002/0163054 A1* | 11/2002 | Suda | H01L 27/14627 257/E31.127 |
| 2008/0037104 A1* | 2/2008 | Hagood | G02B 26/00 445/24 |
| 2009/0251426 A1* | 10/2009 | Lee | G06F 3/0412 345/173 |
| 2011/0260949 A1* | 10/2011 | Ahn | H01J 11/44 345/1.3 |
| 2012/0113614 A1* | 5/2012 | Watanabe | G02F 1/13336 361/810 |
| 2013/0182205 A1* | 7/2013 | Hibayashi | G02F 1/133514 359/891 |
| 2017/0123133 A1* | 5/2017 | Park | G02B 6/0078 |
| 2018/0061903 A1* | 3/2018 | Yang | H10K 59/35 |
| 2018/0108303 A1* | 4/2018 | Park | G09G 3/3413 |
| 2019/0131381 A1* | 5/2019 | Tang | H10K 59/18 |
| 2020/0013846 A1* | 1/2020 | Kwon | H10K 59/18 |
| 2020/0142242 A1* | 5/2020 | Kikuchi | G02B 6/0088 |
| 2021/0134249 A1* | 5/2021 | Wu | G09G 5/00 |

* cited by examiner

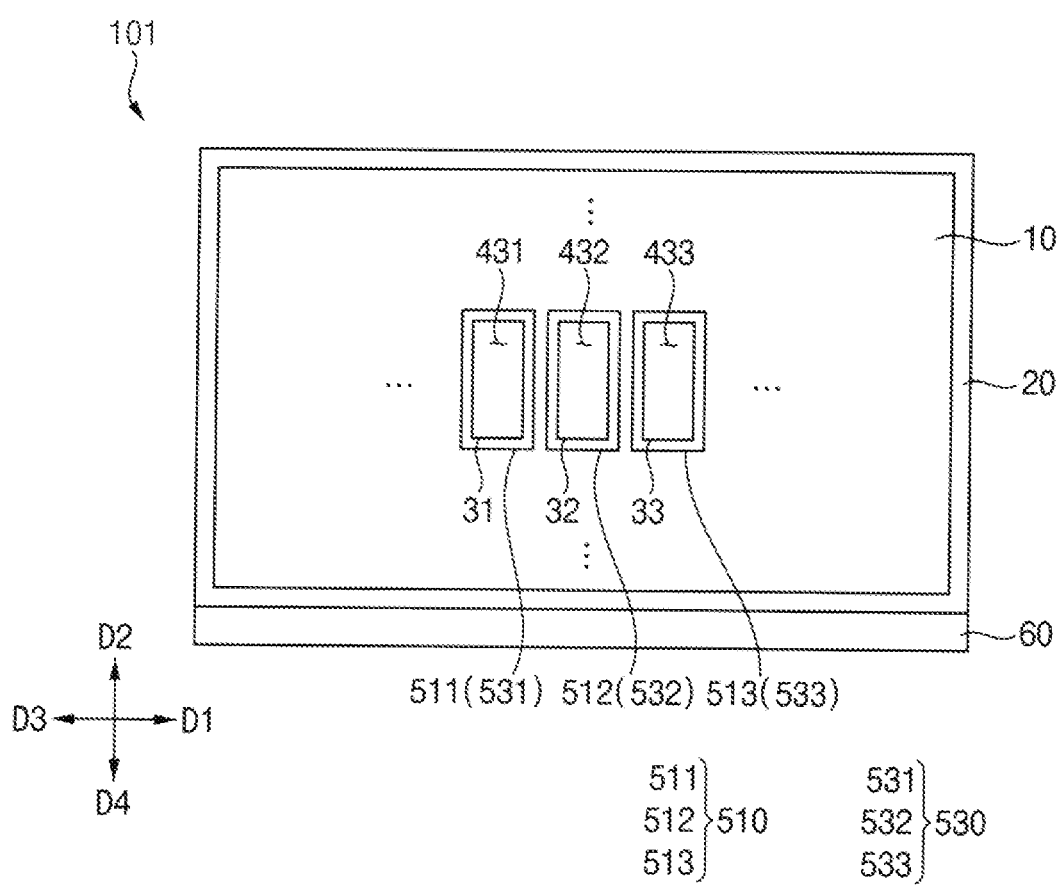

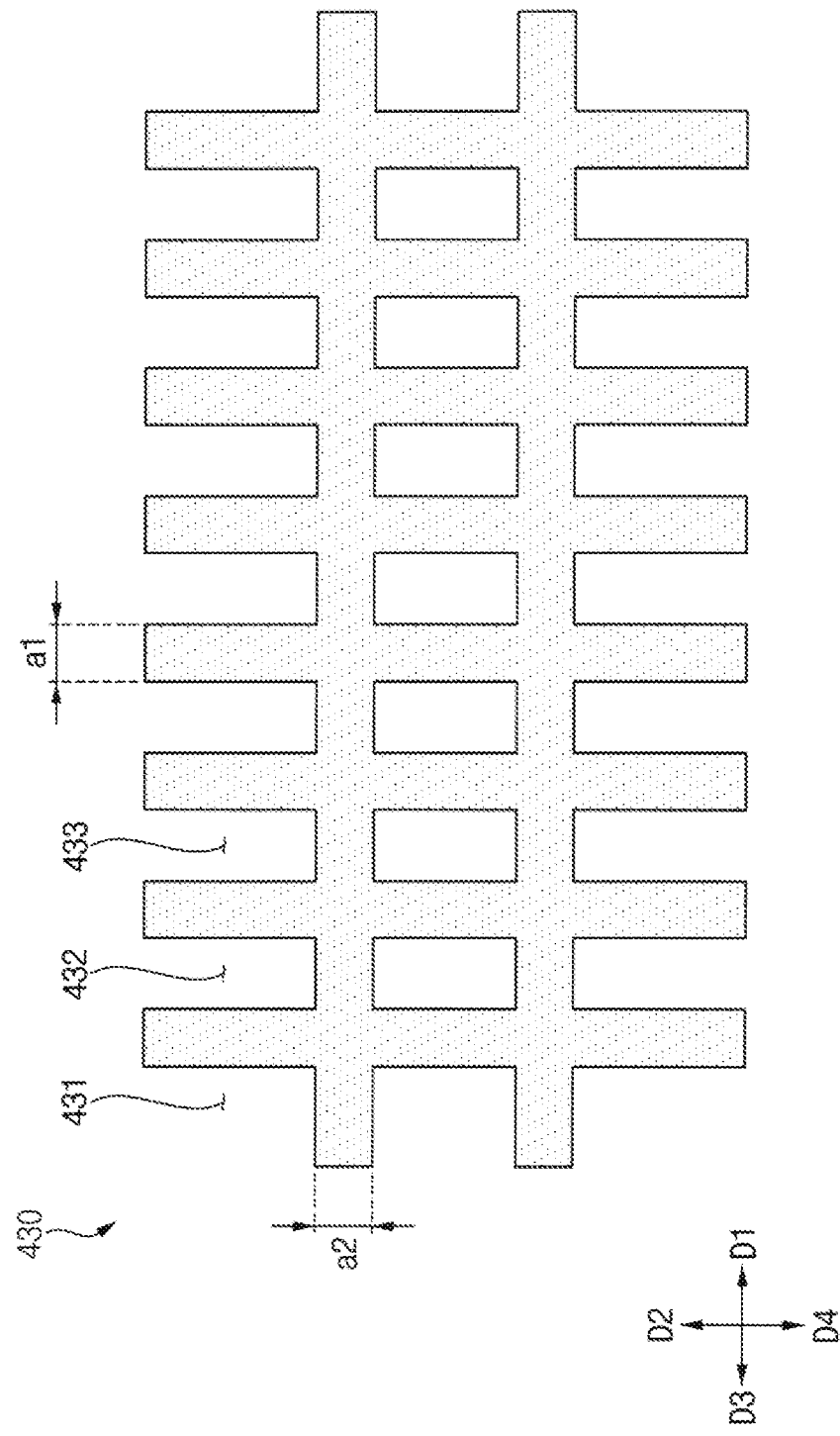

DISPLAY DEVICE INCLUDING COUPLED DISPLAY PANELS

This application claims priority to Korean Patent Application No. 10-2020-0172360 filed on Dec. 10, 2020, and all the benefits accruing therefrom under 35 U.S.C. § 119, the entire disclosure of which is incorporated herein by reference.

BACKGROUND

1. Field

Embodiments relate generally to a display device. More particularly, embodiments of the invention relate to a display device including display panels.

2. Description of the Related Art

Flat panel display devices are used as display devices for replacing a cathode ray tube display device due to lightweight and thin characteristics of the flat panel display devices. As representative examples of such flat panel display devices, there are a liquid crystal display device and an organic light emitting display device.

A display device (e.g., a tiling display device or tiled display device), which combines at least two display panels to implement a large display panel, has been developed. For example, the display panels may be the same as each other, and each of the display panels may include a display region and a peripheral region which surrounds the display region. Here, the display region is a region in which an image is displayed, and a pixel or the like may be disposed in the display region to generate and/or display the image. In addition, the peripheral region is a region in which an image is not displayed, and signal wires or the like which are connected to the pixel may be disposed in the peripheral region.

SUMMARY

Embodiments provide a display device including display panels.

According to embodiments, a display device includes a first display panel, a second display panel, and an optical member. The first display panel includes a first substrate and a first cover member on the first substrate. The second display panel is coupled to a first side of the first display panel, and includes a second substrate and a second cover member on the second substrate. The optical member is in a groove defined by the first and second cover members at a boundary between the first and second display panels.

In embodiments, the first display panel may further include a first light shielding member on the first substrate, and openings may be defined in the first light shielding member. The second display panel may further include a second light shielding member on the second substrate, and openings may be defined in the second light shielding member.

In embodiments, each of the first and second substrates may include a display region and a peripheral region which is adjacent to the display region.

In embodiments, the optical member may be in the peripheral region adjacent to the boundary of the first and second display panels.

In embodiments, each of the first and second light shielding member may be in the display region, and may not be in the peripheral region.

In embodiments, a width in a first direction of each of the first and second light shielding members in the display region may be identical to a width in the first direction of the optical member.

In embodiments, a width in a first direction of each of the first and second light shielding members in the display region may be twice a width in the first direction of the peripheral region In embodiments, each of the first and second light shielding members may be in a portion of the display region and the peripheral region.

In embodiments, the optical member and the first and second light shielding members may include same materials.

In embodiments, each of the first and second display panels may further include first, second, and third optical filters on the substrate and first, second, and third color filters on the first, second, and third optical filters.

In embodiments, the first to third color filters may be in the openings of each of the first and second light shielding members.

In embodiments, the first optical filter may convert a light of a third color to a light of a first light, and the second optical filter may convert the light of the third color to a light of a second light. The third optical filter may transmit the light of the third color.

In embodiments, each of the first and second display panels may further include a sub-pixel structure between the substrate and the first to third optical filters. The light of the third color may be emitted from the sub-pixel structure.

In embodiments, the optical member and the third optical filter may include same materials.

In embodiments, each of the first and second cover members may be extended along a profile of the first to third optical filters and the first to third color filters on the first to third optical filters and the first to third color filters.

In embodiments, the display device may further include a third display panel. The third display panel may be coupled to a second side of the first display panel, and may include a third substrate and a third cover member on the third substrate.

In embodiments, the optical member may be in a groove defined by the first and third cover members at a boundary between the first and third display panels.

In embodiments, the display device may further include a fourth display panel. The fourth display panel may be coupled to a first side of the third display panel and a first side of the second display panel, and may include a fourth substrate and a fourth cover member on the fourth substrate. The optical member may be in both a groove defined by the third and fourth cover members at a boundary between the third and fourth display panels and a groove defined by the second and fourth cover members at a boundary between the second and fourth display panels.

In embodiments, the first and second display panels may be arranged in a first direction, and the third and fourth display panels may be arranged in the first direction. A shape of the third and fourth display panels may be a shape in which the first and second display panels are rotated 180 degrees.

In embodiments, the optical member may have a cross shape in a plan view of the display device.

In embodiments, the first substrate may further include a display region and a peripheral region which is adjacent to the display region.

In embodiments, the first display panel may further include a first light shielding member, a first capping layer, and a second capping layer. The first light shielding member may be on the first substrate, and openings may be in the first light shielding member. The first capping layer may be on the first shielding member. The second capping layer may be between the first capping layer and the first cover member.

In embodiments, the first capping layer may be spaced apart from the second capping layer by the first light shielding member in the display region, and the first capping layer may be in contact with the second capping layer in the peripheral region adjacent to the boundary.

In embodiments, the first substrate may further include a pad region located at a side of the peripheral region.

In embodiments, the first display panel may further include a sub-pixel structure in the display region on the first substrate, a pad electrode in the pad region on the first substrate, and a signal wire electrically connecting the pad electrode and the sub-pixel structure to each other.

In embodiments, the signal wire may not be in the peripheral region which surrounds the display region except for the peripheral region adjacent to the pad region.

In one or more embodiment of the display device, the first and second widths of the light shielding member in the display region may have the same as the third and fourth widths of the light shielding member and the optical member which are in the peripheral regions adjacent to the boundaries. Accordingly, when the display device is viewed from outside thereof, unnaturalness of an image at the boundaries may not be perceived.

In one or more embodiment of the display device, the first and second widths of the light shielding member in the display region may have the same as the third and fourth widths of the optical member in the peripheral regions adjacent to the boundaries. Accordingly, when the display device is viewed from outside thereof, unnaturalness of an image at the boundaries may not be perceived.

In one or more embodiment of the display device, the optical member in the peripheral regions adjacent to the boundaries includes transparent materials and the signal wires, the gate driver and the data driver, etc. are not in the peripheral region surrounding the display region except for the peripheral region adjacent to the pad region, such that the peripheral regions adjacent to the boundaries may be transparent. Accordingly, when the display device is viewed from outside thereof, unnaturalness of an image at the boundaries may not be perceived.

As the third optical filter in the third sub-pixel region of the first display panel adjacent to the second display panel extends into the peripheral regions adjacent to the boundary of the first display panel and the second display panel, when the display device is viewed from outside thereof, unnaturalness of an image at the boundaries may not be perceived.

BRIEF DESCRIPTION OF THE DRAWINGS

Embodiments can be understood in more detail from the following description taken in conjunction with the accompanying drawings.

FIG. 2 is a plan view of an embodiment of a display region, a peripheral region, and sub-pixel regions which are included in each of the display panels of FIG. 1A.

FIG. 8B is a plan view showing an embodiment of a light shielding member included in the display device of FIG. 8A.

DETAILED DESCRIPTION

Figure 1A:
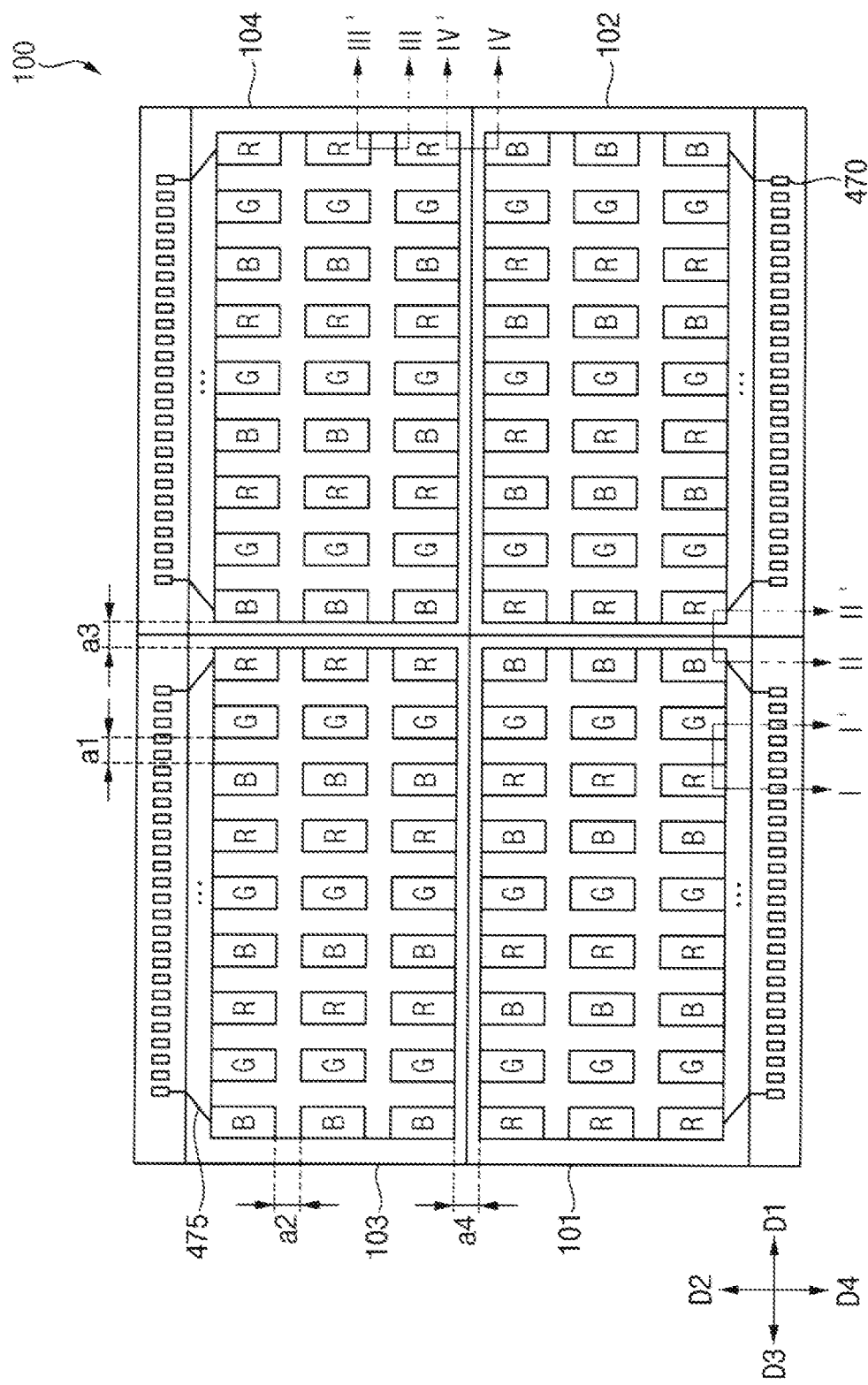
FIG. 1A is a plan view showing an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within +30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Within a tiled display device, display panels may be arranged in a lattice shape or a grid shape. Within the tiled display device, a plurality of stripes may be visually recognized from outside the tiled display device due to a peripheral area at which an image is not displayed corresponding to an area where the display panels are adjacent to each other (e.g., boundary area). Accordingly, the image viewed from outside the tiled display device may appear unnatural owing to the plurality of stripes.

Hereinafter, embodiments of display devices will be described in detail with reference to the accompanying drawings. In the accompanying drawings, same or similar reference numerals refer to the same or similar elements.

Figure 1B:
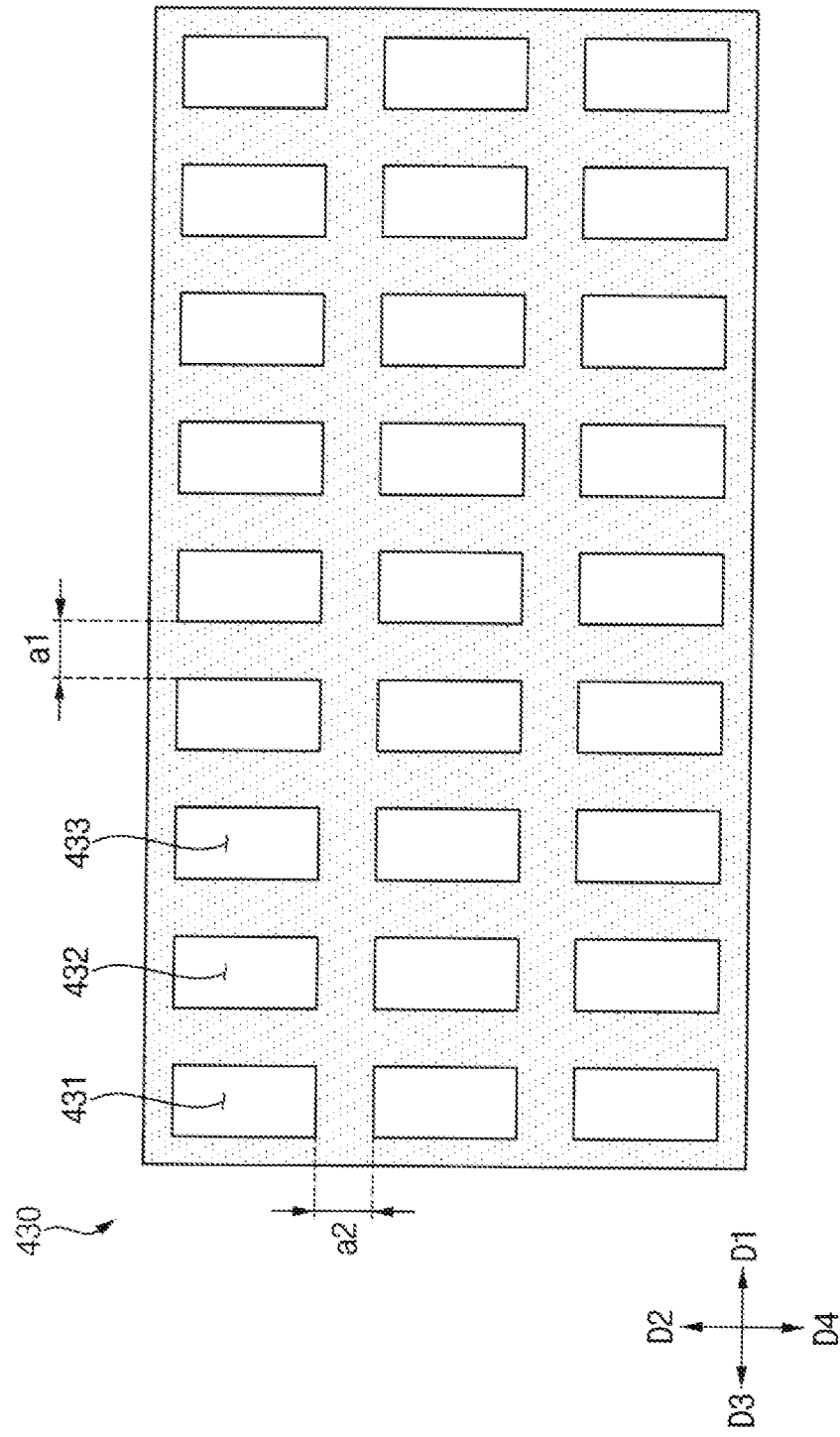
FIG. 1B is a plan view showing an embodiment of a light shielding member included in the display device of FIG. 1A.
Figure 3:
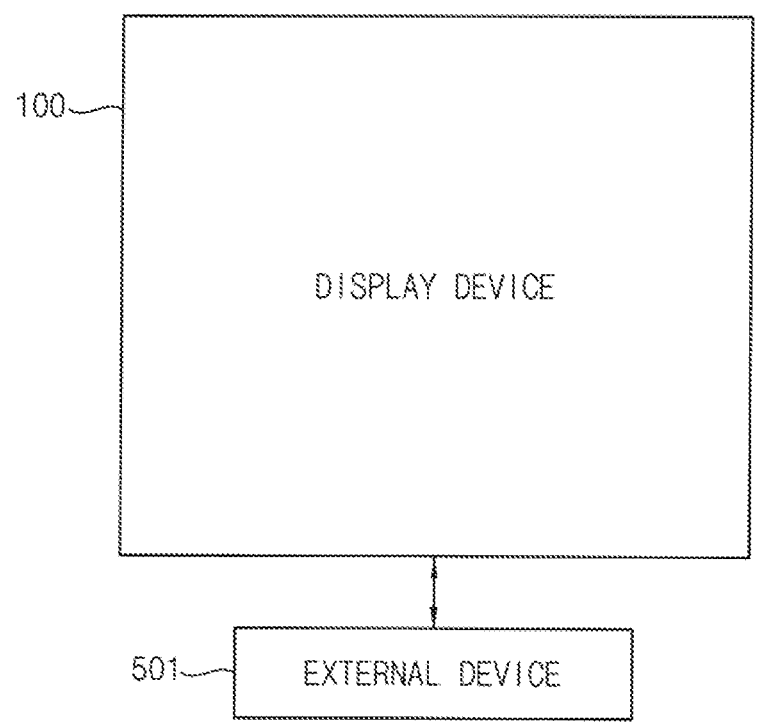
FIG. 3 is a block diagram of an embodiment of an external device electrically connected to the display device of FIG. 1A.

FIG. 1A is a plan view showing an embodiment of a display device 100, and FIG. 1B is a plan view showing an embodiment of a light shielding member 430 included in the display device 100 of FIG. 1A. FIG. 2 is a plan view for explaining a display region 10, a peripheral region 20, and sub-pixel regions which are included in each of the display panels of FIG. 1A, and FIG. 3 is a block diagram for explaining an embodiment of an external device 501 electrically connected to the display device 100 of FIG. 1A.

Referring to FIGS. 1A, 1B, 2, and 3, a display device 100 may include a first display panel 101, a second display panel 102, a third display panel 103, and a fourth display panel 104. In embodiments, both a size and a shape of each of the first to fourth display panels 101, 102, 103, and 104 may be the same.

The first display panel 101 may be coupled (or connected) to the second display panel 102 at a first side of the first display panel 101. In other words, the first display panel 101 and the second display panel 102 may be arranged in (or along) a first direction D1 that is parallel to an upper surface of the display device 100, and may be disposed adjacent to each other in the first direction D1. In an embodiment, for example, the first display panel 101 and the second display panel 102 may be bonded to each other through an adhesive member between the first display panel 101 and the second display panel 102, or the first display panel 101 and the second display panel 102 may be fixed to each other through a connection member.

In addition, the first display panel 101 may be coupled to the third display panel 103 at a second side of the first display panel 101. In other words, the first display panel 101 and the third display panel 103 may be arranged in a second direction D2 that crosses the first direction D1, and may be disposed adjacent to each other in the second direction D2. The first direction D1 may be perpendicular to the second direction D2, without being limited thereto. In an embodiment, for example, the first display panel 101 and the third display panel 102 may be bonded to each other through an adhesive member between the first display panel 101 and the third display panel 103, or the first display panel 101 and the third display panel 102 may be fixed to each other through a connection member.

Further, the third display panel 103 and the second display panel 102 may each be coupled to the fourth display panel 104 at a first side of the third display panel 103 and at a second side of the second display panel 102, respectively. In other words, the third display panel 103 and the fourth display panel 104 may be arranged in the first direction D1, and may be disposed adjacent to each other in the first direction D1. In addition, the second display panel 102 and the fourth display panel 104 may be arranged in the second direction D2, and may be disposed adjacent to each other in the second direction D2. In an embodiment, for example, the second and third display panels 102 and 103 may be respectively bonded to the fourth display panel 104 through an adhesive member between each of the second and third display panels 102 and 103 and the fourth display panel 104, or the second and third display panels 102 and 103 and the fourth display panel 104 may be fixed to each other through a connecting member.

Figure 5:
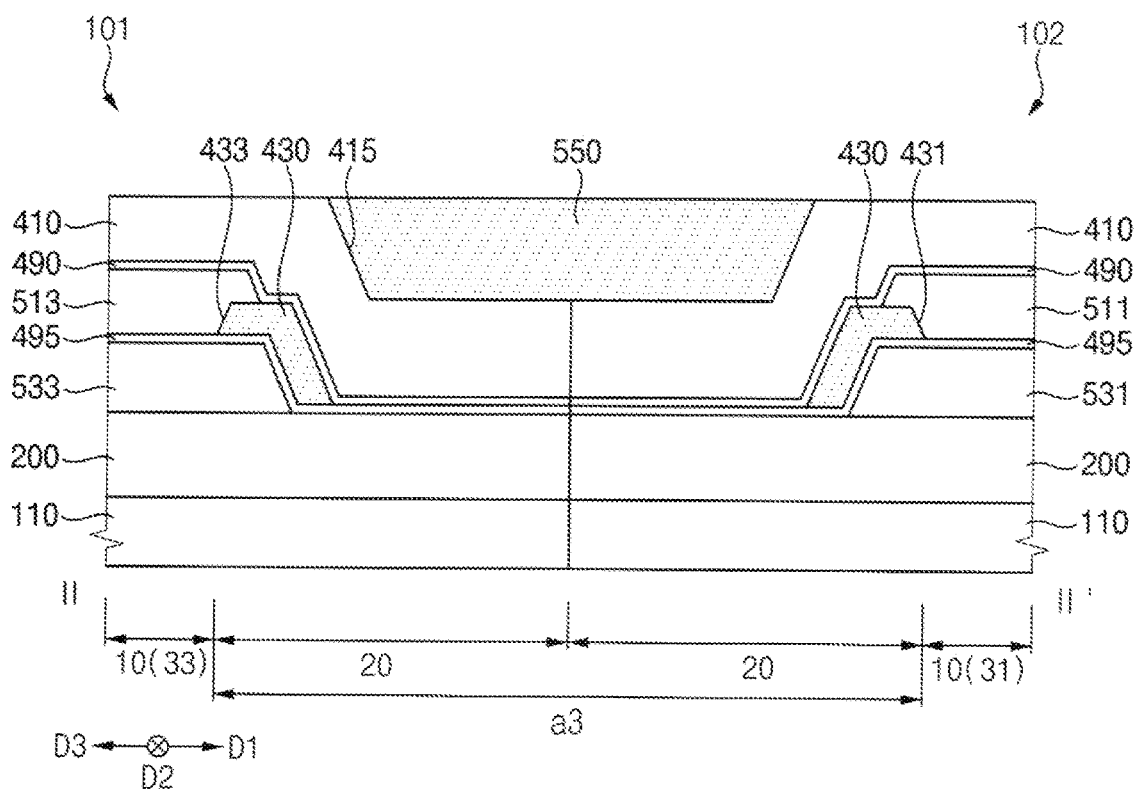
FIG. 5 is a cross-sectional view taken along line II-II' of FIG. 1A.
Figure 7:
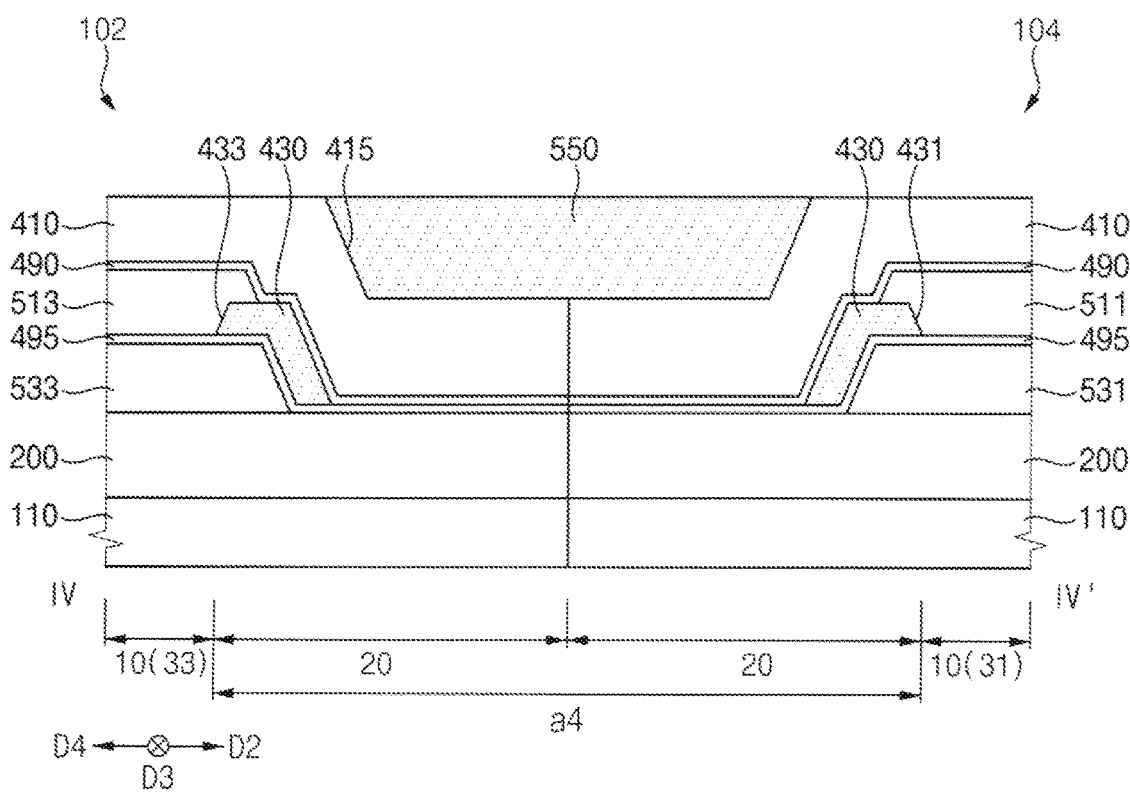
FIG. 7 is a cross-sectional view taken along line IV-IV' of FIG. 1A.

In this way, as the four display panels are coupled to each other, boundaries may exist or may be defined between the first and second display panels 101 and 102, between the third and fourth display panels 103 and 104, between the first and third display panels 101 and 103, and between the second and fourth display panels 102 and 104 (refer to FIGS. 1A, 5, and 7).

While the display device 100 is shown including four display panels, but is not limited thereto. In an embodiment, for example, the display device 100 may include a plurality of display panels. In this case, the first, second, third, and fourth display panels 101, 102, 103, and 104 may be repeatedly arranged along the first direction D1 and/or the second direction D2. In other words, the first to fourth display panels 101, 102, 103, and 104 as a group of display panels may be arranged in a lattice shape (or a grid shape), when viewed in a plan view of the display device 100. The plurality of display panels within the group of display panels may be disposed in a plane defined by the first direction D1 and the second direction D2 crossing each other. A thickness direction of the plurality of display panels and various layers and component thereof crosses the plane defined by the first direction D1 and the second direction D2, e.g., the plan view.

Referring again to FIGS. 1A and 2, each of the first, second, third, and fourth display panels 101, 102, 103, and 104 may have a display region 10 provided in plural including a plurality of display regions 10, a peripheral region 20 provided in plural including a plurality of peripheral regions 20, and a pad region 60 provided in plural including a plurality of pad regions 60. Here, within a same display panel, the peripheral region 20 may be adjacent to the display region 10 and may substantially surround the display region 10. The pad region 60 may be located on a side of the peripheral region 20, such that a portion of the peripheral region 20 is between the display region 10 and the pad region 60.

The display region 10 may include first, second, and third sub-pixel regions 31, 32, and 33. The first, second, and third sub-pixel regions 31, 32, and 33 may be arranged along the first direction D1, and may be spaced apart from each other. In other words, the second sub-pixel region 32 may be spaced apart from the first sub-pixel region 31 in the first direction D1, and the third sub-pixel region 33 may be spaced apart from the second sub-pixel region 32 in the first direction D1. In an embodiment, for example, in a plan view of the display device 100, the first, second, and third sub-pixel regions 31, 32, and 33 may be repeatedly arranged within the display region 10 in the first direction D1 and/or the second direction D2.

In embodiments, as illustrated in FIG. 1A, sub-pixel regions which are located in the outermost part of the display region 10 (e.g., outermost sub-pixel regions) among the first, second, and third sub-pixel regions 31, 32, and 33 respectively in each of the first, second, third, and fourth display panels 101, 102, 103, and 104 may be aligned with a boundary defined between the display region 10 and the peripheral region 20. In other words, at least one side of each of the sub-pixel regions which are located in the outermost part of the display region 10 among the first, second, and third sub-pixel regions 31, 32, and 33 may overlap or correspond to the boundary. In an embodiment, for example, first outermost sub-pixel regions which are closest to a corner of the display region 10 among the sub-pixel regions located in the outermost part of the display region 10 may have two sides respectively aligned with the boundary, and second outermost sub-pixel regions which are spaced apart from the corner of the display region 10 among the sub-pixel regions located in the outermost part of the display region 10 may have only one side aligned with the boundary.

In addition, in embodiments, both a size and a shape of the display region 10 included in each of the first, second, third, and fourth display panels 101, 102, 103, and 104 may be the same to each other, and both a size and a shape of the peripheral region 20 included in each of the first, second, third, and fourth display panels 101, 102, 103, and 104 may be the same to each other. In addition, both a size and a shape of the first to third sub-pixel regions 31, 32, and 33 included in each of the first, second, third, and fourth display panels 101, 102, 103, and 104 may be the same to each other. In an embodiment, for example, a shape of the third and fourth display panels 103 and 104 may have a shape in which the first and second display panels 101 and 102 are rotated 180 degrees. That is, since the first, second, third, and fourth display panels 101, 102, 103, and 104 are composed of a group of display panels having a same structure as each other, the first, second, third, and fourth display panels 101, 102, 103, and 104 may have a red, green and blue ("RGB") arrangement illustrated in FIG. 1A. Here, R is defined as a light of a red color, and G is defined as a light of a green color. In addition, B is defined as a light of a blue color, and RGB may correspond to a color of a light emitted from the display device 100 to outside thereof. In an embodiment, for example, each of the first display panel 101, the second display panel 102, the third display panel 103 and the fourth display panel 104 includes a display region 10 including a plurality of light emitting openings having an arrangement, and the arrangement of the plurality of the light emitting openings of the first display panel 101 and the second display panel 102 is the arrangement of the plurality of the light emitting openings of the third display panel 103 and the fourth display panel 104 rotated 180 degrees.

Further, a distance between two sub-pixel regions which are adjacent in the first direction D1 (e.g., closest to each other along the first direction D1) among the first to third sub-pixel region 31, 32, and 33 included in the first, second, third, and fourth display panels 101, 102, 103, and 104 may be a first width a1, and a distance between two sub-pixel regions, which are adjacent in the second direction D2 (e.g., closest to each other along the second direction D2) among the first to third sub-pixel region 31, 32, and 33 may be a second width a2.

A total width of two peripheral regions which are adjacent in the first direction D1 among the peripheral regions 20 in adjacent display panels among the first, second, third, and fourth display panels 101, 102, 103, and 104 may be a third width a3, and a total width of two peripheral regions which are adjacent in the second direction D2 among the peripheral regions 20 in the adjacent display panels may be a fourth width a4.

In embodiments, the first width a1, the second width a2, the third width a3, and the fourth width a4 may be the same. In an embodiment, for example, the third width a3 in the first direction D1 which includes a total of both the peripheral region 20 of the first display panel 101 which is closest to the boundary where the first display panel 101 and the second display panel 102 are coupled to each other (or the peripheral region 20 of the third display panel 103 which is closest to the boundary where the third display panel 103 and the fourth display panel 104 are coupled to each other) and the peripheral region 20 of the second display panel 102 which is closest to the boundary where the first display panel 101 and the second display panel 102 are coupled to each other (or the peripheral region 20 of the fourth display panel 104 which is closest to the boundary where the third display panel 103 and the fourth display panel 104 are coupled to each other) may be the same as the first width a1 within the display region 10.

Similarly, the fourth width a4 in the second direction D2 which includes a total of both the peripheral region 20 of the first display panel 101 which is closest to the boundary where the first display panel 101 and the third display panel 103 are coupled to each other (or the peripheral region 20 of the second display panel 102 which is closest to the boundary where the second display panel 102 and the fourth display panel 104 are coupled to each other) and the peripheral region 20 of the third display panel 103 which is closest to the boundary where the first display panel 101 and the third display panel 103 are coupled to each other (or the peripheral region 20 of the fourth display panel 104 which is closest to the boundary where the second display panel 102 and the fourth display panel 104 are coupled to each other) may be the same as the second width a2.

In addition, the third width a3 in the first direction D1 as a total of both the peripheral regions 20 of the first display panel 101 and the second display panel 102 which are closest to the boundary where the first display panel 101 and the second display panel 102 are coupled to each other may be the same as the fourth width a4 in the second direction D2 as a total of both the peripheral regions 20 of the first display panel 101 and the third display panel 103 which are closest to the boundary where the first display panel 101 and the third display panel 103 are coupled to each other.

Each of the first, second, third, and fourth display panels 101, 102, 103, and 104 may further include first to third sub-pixels (e.g., a sub-pixel structure 200 of FIGS. 4 to 7). Here, the sub-pixels included in each of the first to fourth display panels 101, 102, 103, and 104 may have the same structure. The first to third sub-pixels may be disposed in the first to third sub-pixel regions 31, 32, and 33, respectively. In other words, shapes of the first to third sub-pixel regions 31, 32, and 33 and shapes of the first to third sub-pixels may be the substantially same. In an embodiment, for example, each of the first to third sub-pixels may generate and/or emit a light of a blue color. The display device 100 may display an image through the first to third sub-pixels.

In embodiments, the first sub-pixel disposed in the first sub-pixel region 31 may emit a light of a red color, and the second sub-pixel disposed in the second sub-pixel region 32 is a light of a green color may be emitted. In addition, the third sub-pixel disposed in the third sub-pixel region 33 may emit a light of a blue color. In embodiments, a sub-pixel emitting a light of a green color or a light of a blue color may be disposed in the first sub-pixel region 31, and a sub-pixel emitting a light of a red color or a light of a blue color may be disposed in the second sub-pixel region 32. In addition, a sub-pixel emitting a light of a red color or a light of a green color may be disposed in the third sub-pixel region 33.

The pad region 60 may be located adjacent to a side of the display region 10 of each of the first to fourth display panels 101, 102, 103, and 104. A respective display panel may have a first side facing a fourth side along the first direction D1 and a second side facing a third side along the second direction D2. In an embodiment, for example, the pad region 60 may be located at a third side of the first display panel 101 which faces the second side of the first display panel 101. The first display panel 101 may be located adjacent to a second side of the third display panel 103, and the pad region 60 is located in a third side facing the second side of the third display panel 103. Here, the pad region 60 of the first display panel 101 and the pad region 60 of the third display panel 103 may face each other.

In addition, the first display panel 101 may be located adjacent to a fourth side of the second display panel 102, and the pad region 60 may be located in a third side facing the second side of the second display panel 102. The second display panel 102 may be located adjacent to a second side of the fourth display panel 104, and the third display panel 103 may be located adjacent to a fourth side of the fourth display panel 104. The pad region 60 may be located at a third side facing the second side of the fourth display panel 104. Here, the pad region 60 of the second display panel 102 and the pad region 60 of the fourth display panel 104 may face each other.

The pad region 60 may have a length which is larger than a width and the length may extend in a direction. Accordingly, the pad region 60 of the first display panel 101 and the pad region 60 of the second display panel 102 may extend along the first direction D1 (e.g., extension direction), and the pad region 60 of the third display panel 103 and the pad region 60 of the fourth display panel 104 may extend along the first direction D1.

Referring again to FIGS. 2 and 3, each of the first, second, third, and fourth display panels 101, 102, 103, and 104 may further include a pad electrode 470 provided in plural including a plurality of pad electrodes 470. The pad electrode 470 may be disposed in the pad region 60 of each of the first to fourth display panels 101, 102, 103, and 104. The pad electrode 470 may be electrically connected to the first to third sub-pixels disposed in the display region 10. In addition, the pad electrode 470 may be electrically connected to the external device 501. The external device 501 may generate an electrical signal such as a data signal, a gate signal, a power supply voltage, etc. The data signal, the gate signal, the power supply voltage may be provided to the pad electrode 470 from outside the display device 100, and the data signal, the gate signal, the power supply voltage may be provided from the pad electrode 470 to the display device 100. That is, as illustrated in FIG. 3, the display device 100 may be electrically connected to the external device 501. The pad electrode 470 may include a metal, an alloy of a metal, a metal nitride, a conductive metal oxide, a transparent conductive material, or the like. These may be used alone or in suitable combination thereof. In other embodiments, the pad electrode 470 may have a multi-layered structure including a plurality of metal layers. In an embodiment, for example, the metal layers may have different thicknesses or may include different materials.

In addition, each of the first to fourth display panels 101, 102, 103, and 104 may further include a signal wire 475 provided in plural including a plurality of signal wires 475 disposed in a part of the peripheral region 20 (e.g., the peripheral region 20 adjacent to the pad region 60). Here, the signal wire 475 may extend from the peripheral region 20 to the display region 10, and may be electrically connected to the sub-pixel structures. In an embodiment, for example, the data signal, the gate signal, and the power supply voltage from an external device 501 may be provided through a pad electrode 470 and to the signal wire 475 disposed in the peripheral region 20, and the signals and the power supply voltage may be provided from the signal wire 475 to the sub-pixel structures through the signal wire 475. In embodiments, the signal wire 475 may not be disposed in a remaining portion of the peripheral region 20 (e.g., the peripheral region 20 adjacent to a left of the display region 10, the peripheral region 20 adjacent to a right, and the peripheral region 20 adjacent to a top of the display region 10) except for a portion of the peripheral region 20 which is adjacent to the pad region 60.

Referring again to FIGS. 1A, 1B, and 2, each of the first, second, third, and fourth display panels 101, 102, 103, and 104 may further include a light shielding member 430 to provide the light shielding member 430 illustrated in FIG. 1B.

In each of the first, second, third, and fourth display panels 101, 102, 103, and 104, the light shielding member 430 may be disposed in the display region 10 and a part of the peripheral region 20, and may include first, second, and third openings 431, 432, and 433 as a plurality of light emitting openings overlapping (or corresponding to) the first, second, and third sub-pixel regions 31, 32, and 33, respectively. In other words, the light shielding member 430 may be disposed in the display region 10 and a part of the peripheral region 20 except for the first, second, and third sub-pixel regions 31, 32, and 33. In an embodiment, for example, the first opening 431 may overlap (or correspond to) the first sub-pixel region 31, and the second opening 432 may overlap (or correspond to) the second sub-pixel region 32. The third opening 433 may overlap (or correspond to) the third sub-pixel region 33. Lights generated from the sub-pixels may be emitted to outside the display device 100 through the first to third openings 431, 432, and 433.

In addition, since the light shielding member 430 is disposed in the display region 10, reflection of external light by semiconductor elements, signal wires 475, etc. disposed in the display region 10 may be reduced or effectively prevented. The light shielding member 430 is disposed in a part of the peripheral region 20, such that reflection of external light from outside the display device 100 by the semiconductor devices, etc. in a part of the peripheral region 20 may be reduced or effectively prevented.

Further, as the first, second, and third sub-pixel regions 31, 32, and 33 have the same size and shape, the size and shape of each of the first to third openings 431, 432, 433 may be the same. That is, the size and shape, the size and shape of each of the first to third openings 431, 432, 433 corresponds to the size and shape of the first, second, and third sub-pixel regions 31, 32, and 33.

In embodiments, a width of the light shielding member 430 located between two openings, which are adjacent in the first direction D1, among the first to third openings 431, 432, and 433 may correspond to the first width a1, and a width of the light shielding member 430 located between two openings, which are adjacent in the second direction D2, among the first to third openings 431, 432 and 433 may correspond to the second width a2. As described above, the first width a1 and the second width a2 may be the same. In addition, each of the first width a1 and the second width a2 may be twice a width of one of the peripheral region 20 in the first direction D1.

In addition, a width portion of each of the light shielding members 430 respectively disposed in two of the peripheral regions 20 adjacent to each other among the peripheral regions 20 in adjacent display panels among the first, second, third, and fourth display panels 101, 102, 103, and 104 may be less than the first width a1 and the second width a2 in respective directions.

Figure 4:
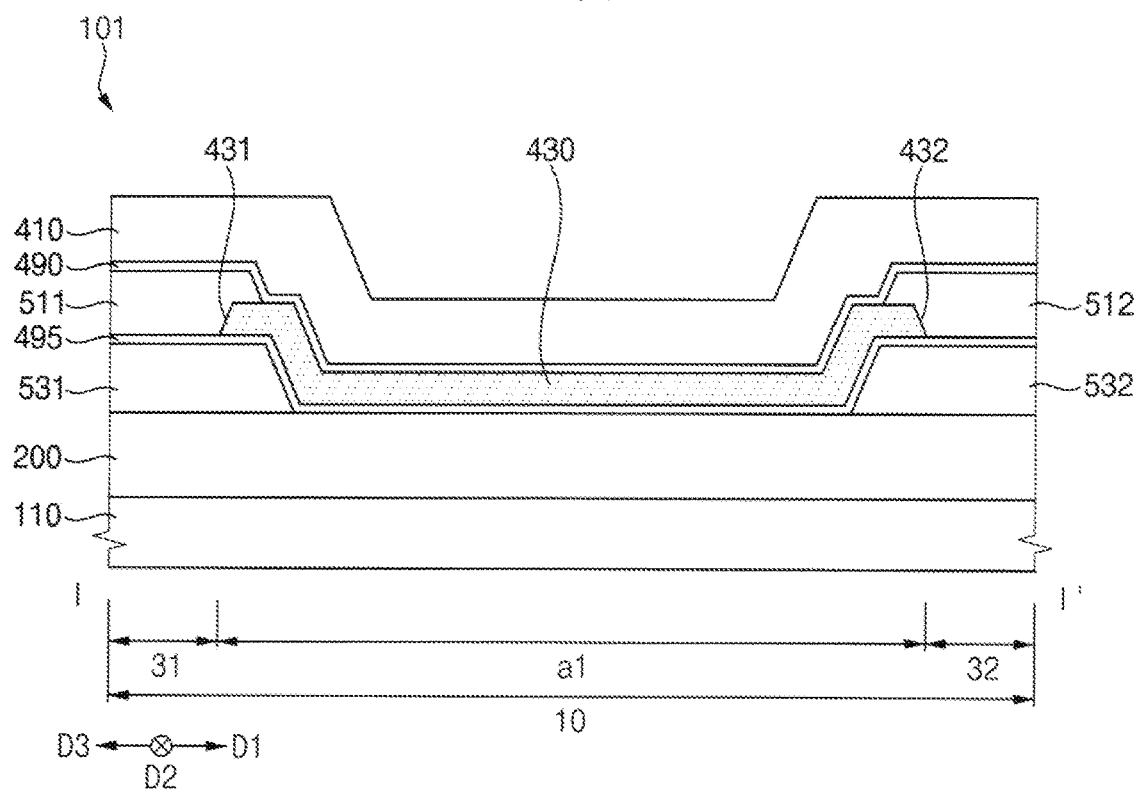
FIG. 4 is a cross-sectional view taken along line I-I' of FIG. 1A.
Figure 6:
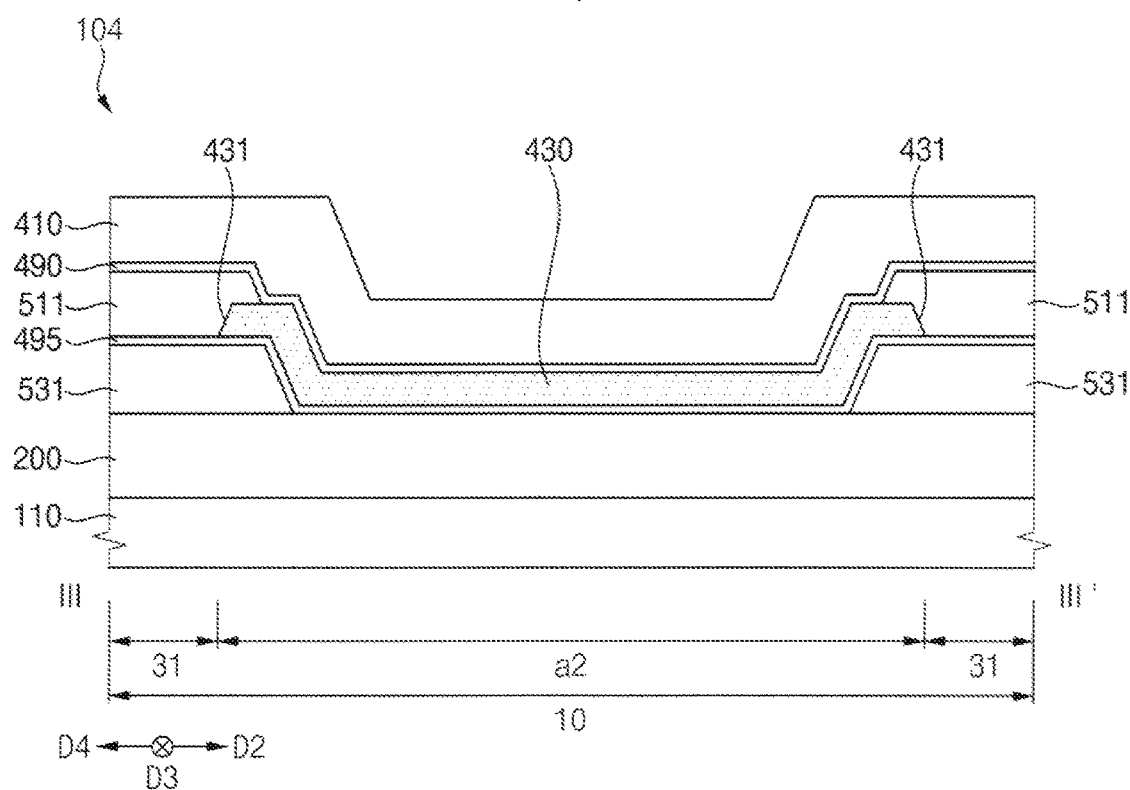
FIG. 6 is a cross-sectional view taken along line III-III' of FIG. 1A.

FIG. 4 is a cross-sectional view taken along line I-I' of FIG. 1A, and FIG. 5 is a cross-sectional view taken along line II-II' of FIG. 1A. FIG. 6 is a cross-sectional view taken along line III-III' of FIG. 1A, and FIG. 7 is a cross-sectional view taken along line IV-IV' of FIG. 1A.

Referring to FIGS. 2, 4, 5, 6, and 7, a display device 100 may include first, second, third, and fourth display panels 101, 102, 103, and 104, an optical member 550, and the like. Here, each of the first, second, third, and fourth display panels 101, 102, 103, and 104 may include a substrate 110, a sub-pixel structure 200, a light shielding member 430, optical filters 530 (e.g., an optical filter layer or color-converting layer), a first capping layer 495, color filters 510 (e.g., a color filter layer), a second capping layer 490, a cover member 410, and the like. In addition, the optical filters 530 may include a first optical filter 531, a second optical filter 532, and a third optical filter 533, and the color filters 510 may include a first color filter 511, a second color filter 512, and a third color filter 513. Further, the light shielding member 430 may include first to third openings 431, 432, and 433, and the sub-pixel structure 200 may include semiconductor elements, insulation layers, signal wires 475, first to third sub-pixels, and the like. The sub-pixel structure 200 may be a display layer or a display element layer which generates light, emits light, displays an image, and the like.

The substrate 110, the light shielding member 430 and the cover member 410 which are included in the first display panel 101 are defined as a first substrate, a first light shielding member and a first cover member, and the substrate 110, the light shielding member 430 and the cover member 410 which are included in the second display panel 102 are defined as a second substrate, a second light shielding member and a second cover member. In addition, the substrate 110, the light shielding member 430 and the cover member 410 which are included in the third display panel 103 are defined as a third substrate, a third light shielding member and a third cover member, and the substrate 110, the light shielding member 430 and the cover member 410 which are included in the fourth display panel 104 are defined as a fourth substrate, a fourth light shielding member and a fourth cover member.

The substrate 110 including transparent or opaque materials may be provided. The substrate 110 may include a quartz substrate, a synthetic quartz substrate, a calcium fluoride substrate, a fluorine-doped quartz substrate, a soda lime glass substrate, a non-alkali glass substrate, etc.

In other embodiments, the substrate 110 may be formed (or provided) by using a flexible transparent resin substrate. The substrate 110 may be formed of a flexible transparent resin substrate. An example of a transparent resin substrate capable of being used as the substrate 110 may be a polyimide substrate. In this case, the polyimide substrate may have a laminated structure (or a stack structure) including a first polyimide layer, a barrier film layer, a second polyimide layer, etc.

As the display device 100 includes a display region 10 including first, second, and third sub-pixel regions 31, 32, and 33, the peripheral region 20, and the pad region 60, the substrate 110 may also be divided into the first, second, and third sub-pixel regions 31, 32, and 33, the display region 10, the peripheral region 20, and the pad region 60.

The sub-pixel structure 200 may be disposed on the substrate 110. In an embodiment, for example, the semiconductor element, the insulation layers, signal wires 475, etc. may be disposed in the display region 10 on the substrate 110, and the insulation layers may be formed in the peripheral region 20 on the substrate 110. In addition, the first to third sub-pixels may be disposed in each of the first, second, and third sub-pixel regions 31, 32, and 33 on the semiconductor element, the insulation layers, and the signal wires 475. An image may be displayed in the display region 10 by control or operation of the first to third sub-pixels. In embodiments, the sub-pixel structure 200 may generate and/or emit a light of a blue color (e.g., a third color).

The first optical filter 531 may be disposed in the first sub-pixel region 31 and a part of the display region 10 adjacent to the first sub-pixel region 31 on the sub-pixel structure 200 (refer to the first optical filter 531 of the first display panel 101 illustrated in FIG. 4, the first optical filter 531 of the second display panel 102 illustrated in FIG. 5, the first optical filter 531 of the fourth display panel 104 illustrated in FIG. 6, and the first optical filter 531 of the fourth display panel 104 illustrated in FIG. 7). The first optical filter 531 may overlap the first color filter 511, and may be disposed under the first color filter 511.

In other words, the first optical filter 531 may be disposed on (or in) the first sub-pixel. A light emitted from the first sub-pixel may pass through the first optical filter 531. The first optical filter 531 may convert a light of a blue color into a light of a red color (e.g., a first color). The first optical filter 531 may include a plurality of quantum dots that absorb a light of a blue color and emit a light of a red color, e.g., color-converts light in a color conversion layer.

The second optical filter 532 may be disposed in the second sub-pixel region 32 and a part of the display region 10 adjacent to the second sub-pixel region 32 on the sub-pixel structure 200 (refer to the second optical filter 532 of the first display panel 101 illustrated FIG. 4). The second optical filter 532 may overlap the second color filter 512, and may be disposed under the second color filter 512. In other words, the second optical filter 532 may be disposed on (or in) the second sub-pixel. A light emitted from the second sub-pixel may pass through the second optical filter 532. The second optical filter 532 may convert a light of a blue color into a light of a green color (e.g., a second color). The second optical filter 532 may include a plurality of quantum dots that absorb a light of a blue color and emit a light of a green color, e.g., color-converts light in a color conversion layer.

The third optical filter 533 may be disposed in the third sub-pixel region 33 and a part of the display region 10 adjacent to the third sub-pixel region 33 on the sub-pixel structure 200 (refer to the third optical filter 533 of the first display panel 101 illustrated FIG. 5 and the third optical filter 533 of the second display panel 102 illustrated FIG. 7). The third optical filter 533 may overlap the third color filter 513, and may be disposed under the third color filter 513. In other words, the third optical filter 533 may be disposed on (or in) the third sub-pixel. A light emitted from the third sub-pixel may pass through the third optical filter 533. The third optical filter 533 may transmit a light of a blue color (e.g., a third color). The third optical filter 533 may include scattering materials that emit a light of a blue color, e.g., transmits light in a color conversion layer without color conversion.

In an embodiment, for example, the quantum dots included in the first optical filter 531 and the second optical filter 532 may include any one among silicon-based nanocrystal, II-VI group-based compound semiconductor nanocrystal, III-V group-based compound semiconductor nanocrystal, IV-VI group-based compound semiconductor nanocrystal, and a combination thereof. The II-VI group-based compound semiconductor nanocrystal may include one selected from the group consisting of CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, and HgZnSTe. The III-V group-based compound semiconductor nanocrystal may include one selected from the group consisting of GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. The IV-VI group-based compound semiconductor nanocrystal may be SbTe.

Even when the quantum dots included in the first and second optical filters 531 and 532 include the same material, a spectrum wavelength may vary according to a size of the quantum dot. In an embodiment, for example, when the size of the quantum dot is smaller, a light having a shorter wavelength may be emitted. Accordingly, the sizes of the quantum dots included in the first and second optical filters 531 and 532 are adjusted, so that a light having a desired visible light zone may be emitted.

In embodiments, the quantum dots included in the first and second optical filters 531 and 532 may be formed of the same material, and the size of the quantum dot included in the first optical filter 531 may be larger than the size of the quantum dot included in the second optical filter 532.

The third optical filter 533 may include TiO, ZrO, AlO3, In2O3, ZnO, SnO2, Sb2O3, ITO, or the like. However, the material of the third optical filter 533 is not limited thereto, and may be variously modified as long as the material scatters a light of a blue color without color-conversion.

Accordingly, the optical filters 530 including the first optical filter 531, the second optical filter 532, and the third optical filter 533 may be disposed in each of the first, second, third, and fourth display panels 101, 102, 103, and 104.

In other embodiments, a blocking structure may be disposed between the first optical filter 531, the second optical filter 532, and the third optical filter 533. The blocking structure may have a plate shape, and a plurality of openings may be formed in the blocking structure. The first optical filter 531, the second optical filter 532, and the third optical filter 533 may be disposed in the openings of the blocking structure. In other words, the blocking structure may define a region in which the first optical filter 531, the second optical filter 532, and the third optical filter 533 are disposed. When the blocking structure is disposed, the first optical filter 531, the second optical filter 532, and the third optical filter 533 may be formed in an inkjet method, and the light shielding member 430 may not be disposed. That is, the blocking structure may function as the light shielding member 430. Accordingly, the blocking structure may have an opaque color (e.g., black). In addition, the blocking structure may be formed as a single layer or may be formed in a structure in which at least two layers are stacked. Otherwise, when the blocking structure is not disposed, the first optical filter 531, the second optical filter 532, and the third optical filter 533 may be formed in a photomask method.

The first capping layer 495 may be disposed in the display region 10 and the peripheral region 20 on both of the optical filters 530 and the sub-pixel structure 200. In an embodiment, for example, the first capping layer 495 may cover the optical filters 530 on the sub-pixel structure 200, and may be disposed along a profile of the optical filters 530 to have a uniform thickness. Alternatively, the first capping layer 495 may sufficiently cover the optical filters 530 on the sub-pixel structure 200, and may have a substantially flat top surface without a step around the profile of the optical filters 530. The first capping layer 495 may include inorganic insulating materials or organic insulating materials. In embodiments, the first capping layer 495 may include inorganic insulating materials such as silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), or the like. In other embodiments, the first capping layer 495 may have a multi-layer structure including a plurality of insulation layers. In an embodiment, for example, the insulation layers may have different thicknesses or may include different materials.

The light shielding member 430 may be disposed in the display region 10 and a part of the peripheral region 20 except for the first, second, and third sub-pixel regions 31, 32, and 33 on the first capping layer 495. In other words, the light shielding member 430 may include the first to third openings 431, 432, and 433, and the first to third openings 431, 432, and 433 may overlap the first, second, and third sub-pixel regions 31, 32, and 33, respectively. In addition, a part of the light shielding member 430 in the display region 10 may be disposed between the optical filters 530 and the color filters 510. In an embodiment, for example, the light shielding member 430 may block or absorb light incident from outside the display device 100. The light shielding member 430 may include organic materials such as a photoresist, a polyacrylic resin, a polyimide resin, a polyamide resin, a siloxane resin, an acrylic resin, an epoxy resin, or the like. In addition, the light shielding member 430 may be substantially opaque. In an embodiment, for example, the light shielding member 430 may further include light shielding materials to absorb light. The light shielding materials may include carbon black, titanium nitride oxide, titanium black, phenylene black, aniline black, cyanine black, nigrosine acid black, black resin, and the like.

As illustrated in FIG. 4, a width of a solid portion of the light shielding member 430 located between the first and second openings 431 and 432 that are adjacent in the first direction D1 may be defined as a first width a1. As illustrated in FIG. 5, a width of a solid portion of the light shielding members 430 disposed in each of two of the peripheral regions 20, which are adjacent in the first direction D1, in the first and second display panels 101 and 102 that are adjacent to each other may be less than the first width a1. That is, the light shielding member 430 of the first display panel 101 (or the second display panel 102) illustrated in FIG. 5 may correspond to an edge (or an outermost portion) of the light shielding member 430 illustrated in FIG. 1B. A total width of two of the peripheral regions 20, which are adjacent in the first direction D1, in the first and second display panels 101 and 102 that are adjacent to each other may be defined as a third width a3.

As illustrated in FIG. 6, a width of a solid portion of the light shielding member 430 located between two of the first openings 431 that are adjacent in the second direction D2 may be defined as a second width a2. As illustrated in FIG. 7, a width of a solid portion of light shielding members 430 disposed in each of two of the peripheral regions 20, which is adjacent in the second direction D2, in the second and fourth display panels 102 and 104 that are adjacent to each other may be less than the second width a2. That is, the light shielding member 430 of the second display panel 102 (or the fourth display panel 104) illustrated in FIG. 7 may correspond to an edge of the light shielding member 430 illustrated in FIG. 1B. A width of two peripheral regions 20, which is adjacent in the second direction D2, in the second and fourth display panels 102 and 104 that are adjacent to each other may be defined as a fourth width a4.

Referring again to FIGS. 3 to 7, the first color filter 511 may be disposed in the first sub-pixel region 31 and a part of the display region 10 adjacent to the first sub-pixel region 31 on the first capping layer 495 and a part of the light shielding member 430 (refer to the first color filter 511 of the first display panel 101 illustrated in FIG. 4, the first color filter 511 of the second display panel 102 illustrated in FIG. 5, the first color filter 511 of the fourth display panel 104 illustrated in FIG. 6, and the first color filter 511 of the fourth display panel 104 illustrated in FIG. 7). The first color filter 511 may overlap the first optical filter 531, and may be disposed on the first optical filter 531. In other words, the first color filter 511 may be disposed on the first sub-pixel. In embodiments, the first color filter 511 may be disposed in the first opening 431. After a light emitted from the first sub-pixel passes through the first optical filter 531, the light may pass through the first color filter 511. The first color filter 511 may transmit a light of a red color and may be a color filter having a red color.

The second color filter 512 may be disposed in the second sub-pixel region 32 and a part of the display region 10 adjacent to the second sub-pixel region 32 on the first capping layer 495 and a part of the light shielding member 430 (refer to the second color filter 512 of the first display panel 101 illustrated in FIG. 4). The second color filter 512 may overlap the second optical filter 532, and may be disposed on the second optical filter 532. In other words, the second color filter 512 may be disposed on the second sub-pixel. In embodiments, the second color filter 512 may be disposed in the second opening 432. After a light emitted from the second sub-pixel passes through the second optical filter 532, the light may pass through the second color filter 512. The second color filter 512 may transmit a light of a green color and may be a color filter having a green color.

The third color filter 513 may be disposed in the third sub-pixel region 33 and a part of the display region 10 adjacent to the third sub-pixel region 33 on the first capping layer 495 and a part of the light shielding member 430 (refer to the third color filter 513 of the first display panel 101 illustrated in FIG. 5 and the third color filter 513 of the fourth display panel 104 illustrated in FIG. 7). The third color filter 513 may overlap the third optical filter 533, and may be disposed on the third optical filter 533. In other words, the third color filter 513 may be disposed on the third sub-pixel. In embodiments, the third color filter 513 may be disposed in the third opening 433. After a light emitted from the third sub-pixel passes through the third optical filter 533, the light may pass through the third color filter 513. The third color filter 513 may transmit a light of a blue color and may be a color filter having a blue color.

Accordingly, the color filters 510 including the first color filter 511, the second color filter 512, and the third color filter 513 may be disposed. The color filters 510 may be manufactured or provided using a photosensitive resin, a color photoresist, or the like.

The second capping layer 490 may be disposed in the display region 10 and the peripheral region 20 on the color filters 510, the light shielding member 430, and the first capping layer 495. In an embodiment, for example, the second capping layer 490 covers the color filters 510 and the light shielding member 430 on the first capping layer 495, and may be disposed along a profile of the color filters 510 and the light shielding member 430 with a uniform thickness. Alternatively, the second capping layer 490 may sufficiently cover the color filters 510 and the light shielding member 430 on the first capping layer 495, and may have a substantially flat top surface without a step around the color filters 510 and the light shielding member 430. The second capping layer 490 may include inorganic insulating materials or organic insulating materials. In embodiments, the second capping layer 490 may include inorganic insulating materials. In other embodiments, the second capping layer 490 may have a multi-layer structure including a plurality of insulation layers. In an embodiment, for example, the insulation layers may have different thicknesses or may include different materials.

The cover member 410 may be disposed in the display region 10 and the peripheral region 20 on the second capping layer 490 (or the color filters 510 and the optical filters 530). In other words, the cover member 410 (e.g., the first, second, third, and fourth cover members) may be disposed on an entirety of the substrate 110 (e.g., the first, second, third, and fourth substrates). In embodiments, the cover member 410 may be disposed along a profile of the second capping layer 490 (or a profile of the color filters 510 and the optical filters 530). Within each of the first display panel 101 and the second display panel 102, for example, closest optical filters which are closest to the first boundary among the plurality of optical filters 530 and closest color filters respectively corresponding to the closest optical filters among the plurality of color filters 510 respectively define a profile extended toward the first boundary, and the first cover member and the second cover member respectively extends along the profile which is defined by the closest optical filters and the closest color filters.

The cover member 410 may be formed to have a relatively thick thickness, and may protect the color filters 510, the optical filters 530, the light shielding member 430, the sub-pixel structure 200, and the like. The cover member 410 may include a high hardness polymer material such as siloxane.

In embodiments, as illustrated in FIG. 5, a groove 415 (e.g., a first groove) defined by both the cover member 410 (e.g., the first cover member) of the first display panel 101 and the cover member 410 (e.g., the second cover member) of the second display panel 102 may be formed on a boundary (e.g., a first boundary) of the first and second display panels 101 and 102 which is defined between the first and second display panels 101 and 102 and where the first and second display panels 101 and 102 meet each other. In an embodiment, for example, since the optical filters 530 and the color filters 510 are not disposed in the peripheral region 20 adjacent to the boundary, a step may occur corresponding to a profile of side surfaces of the optical filters 530 and the color filters 510. Due to the step, the groove 415 may be defined by the first cover member and the second cover member. Similarly, as illustrated in FIG. 7, the groove 415 (e.g., a second groove) defined by both the cover member 410 (e.g., the second cover member) of the second display panel 102 and the cover member 410 (e.g., the fourth cover member) of the fourth display panel 104 may be formed on a boundary (e.g., a second boundary) of the second and fourth display panels 102 and 104. In an embodiment, for example, since the optical filters 530 and the color filters 510 are not disposed in the peripheral region 20 adjacent to the boundary, a step may occur. Due to the step, the groove 415 may be defined by the second cover member and the fourth cover member.

Side surfaces of each of the optical filters 530, the color filters 510 and the light shielding member 430 are spaced apart from the boundaries respectively between the first, second, third, and fourth display panels 101, 102, 103, and 104. The cover member 410 extends along the side surfaces of the above-described elements to form the groove 415.

The optical member 550 may be disposed in the groove 415 of the cover member 410 in the peripheral region 20. As illustrated in FIGS. 5 and 7, the optical member 550 (e.g., a first optical member and a second optical member) may fill the groove 415 in both the peripheral regions 20 adjacent to the boundary of the first and second display panels 101 and 102 and the peripheral regions 20 adjacent to the boundary of the second and fourth display panels 102 and 104. Similarly, the optical member 550 may fill the groove 415 in both the peripheral regions 20 adjacent to the boundary of the first and third display panels 101 and 103 and the peripheral regions 20 adjacent to the boundary of the third and fourth display panels 103 and 104. That is, the optical member 550 may have a cross shape in the plan view of the display device 100. In other words, the optical member 550 may be disposed on the boundaries respectively between the first, second, third, and fourth display panels 101, 102, 103, and 104.

In embodiments, the optical member 550 may include a black ink. In an embodiment, for example, the black ink may be filled in the groove 415 through an inking process. Alternatively, the optical member 550 may contain the same material as the light shielding member 430. In an embodiment, for example, the optical member 550 may block or absorb light incident from the outside as a light shielding pattern. The optical member 550 may include organic materials such as a photoresist, a polyacrylic resin, a polyimide resin, a polyamide resin, a siloxane resin, an acrylic resin, an epoxy resin, or the like. In addition, the optical member 550 may be substantially opaque. In an embodiment, for example, the optical member 550 may further include a light shielding material to absorb a light. The light shielding material may include carbon black, titanium oxynitride, titanium black, phenylene black, aniline black, cyanine black, nigrosine black, black resin, and the like. That is, the optical member 550 may perform the same function as the light shielding member 430.

Accordingly, the display device 100 including the first display panel 101, the second display panel 102, the third display panel 103, the fourth display panel 104, and the optical member 550 may be provided.

In a conventional display device that combines at least two conventional display panels to implement a large display panel, the display panels may be the same as each other, and each of the conventional display panels has a display region 10 and a peripheral region 20. The conventional display panels may be arranged in a lattice shape. In this case, a plurality of stripes may be visually recognized in the conventional display device in a portion where the conventional display panels are disposed adjacent to each other due to the conventional light shielding member disposed in a part of the peripheral region 20 where an image is not displayed. Accordingly, when the conventional display device is observed, unnaturalness of the viewed image may be perceived. In other words, since a width of the conventional light shielding member located in the display region 10 and a width of the conventional light shielding member located in the peripheral region 20 are different, the light shielding member located in the peripheral region 20 may be recognized from outside the conventional display device. Here, the width of the conventional light shielding member located in the peripheral region 20 may be less than the width of the conventional light shielding member located in the display region 10. In an embodiment, for example, since the conventional light shielding member is not provided in an entirety of the peripheral regions 20 at boundaries of the conventional display panels during the manufacturing process of the conventional display panel, the conventional light shielding member may disposed only in a part of the peripheral region 20 adjacent to the boundaries.

In one or more embodiment, the optical member 550 may be disposed in both of the peripheral regions 20 at respective boundaries of the first, second, third, and fourth display panels 101, 102, 103, and 104 (e.g., a first boundary, a second boundary, a third boundary and a fourth boundary). In this case, a width of the light shielding member 430 disposed in the display region 10 (e.g., first width a1 or second width a2) may be the same as a width (e.g., the third width a3 or the fourth width a4) of a light blocking pattern (e.g., the light shielding member 430 together with the optical member 550) disposed in the peripheral regions 20 adjacent to the boundaries. In an embodiment, at a same boundary, a total width of the light shielding member 430 of one display panel, the light shielding member 430 of adjacent display panels, and the optical member 550 may be equal to or more than a distance between the display regions 10 of the two adjacent display panels (e.g., the third width a3 or the fourth width a4).

In one or more embodiment of the display device 100, the first and second widths a1 and a2 of solid portions of the light shielding member 430 disposed in the display region 10 may be the same as the third and fourth widths a3 and a4 of solid portions of the light shielding member 430 and the optical member 550 which are disposed in the peripheral regions 20 adjacent to the boundaries. Accordingly, when the display device 100 is viewed from outside thereof, unnaturalness of an image at the boundaries may not be perceived.

Although one or more embodiment of the display device 100 has been described as an organic light emitting display device, the configuration of the invention is not limited thereto. In other embodiments, the display device 100 may include a liquid crystal display ("LCD"), a field emission display ("FED"), a plasma display panel ("PDP"), and an electrophoretic display device ("EPD"), electronic display, or the like.

Figure 8A:
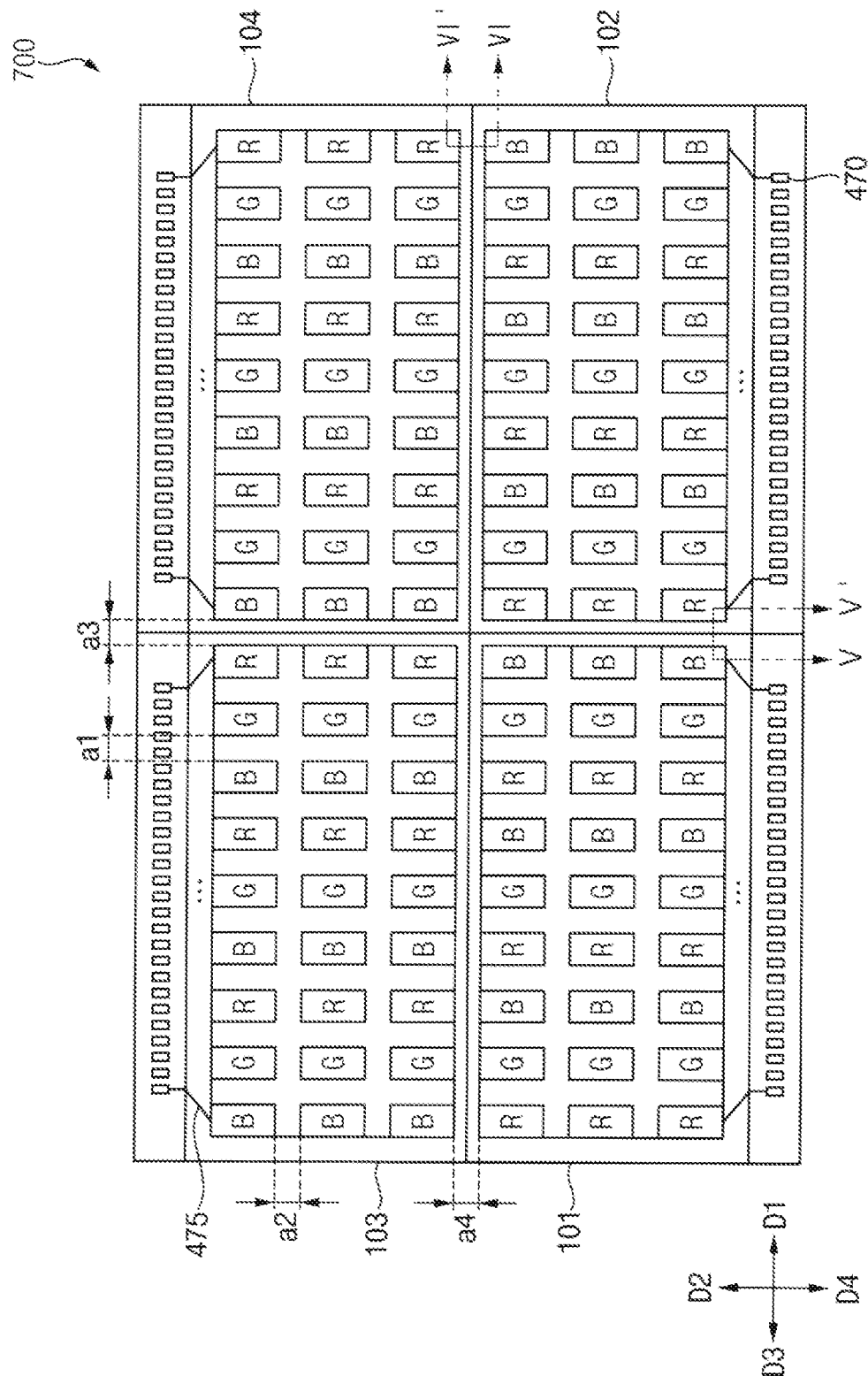
FIG. 8A is a plan view showing an embodiment of a display device.

FIG. 8A is a plan view showing an embodiment of a display device 700, and FIG. 8B is a plan view showing a light shielding member 430 included in the display device 700 of FIG. 8A. A display device 700 illustrated in FIGS. 8A and 8B may have a configuration substantially the same as or similar to the display device 100 described with reference to FIGS. 1A to 3, except for a shape of a light shielding member 430. In FIGS. 8A and 8B, duplicate descriptions for components substantially the same as or similar to the components described with reference to FIGS. 1A to 3 will be omitted.

Referring to FIGS. 2, 8A, and 8B, a display device 700 may include first, second, third, and fourth display panels 101, 102, 103 and 104. In embodiments, each of the first, second, third, and fourth display panels 101, 102, 103, and 104 may have the same size and shape.

A first side of the first display panel 101 may be coupled to the second display panel 102, and a second side of the first display panel 101 may be coupled to the third display panel 103. In addition, a first side of the third display panel 103 and a first side of the second display panel 102 may be coupled to the fourth display panel 104.

Each of the first, second, third, and fourth display panels 101, 102, 103, and 104 may have a display region 10, a peripheral region 20, and a pad region 60. A distance between two sub-pixel regions, which are adjacent in the first direction D1, among the first to third sub-pixel region 31, 32, and 33 included in the first, second, third, and fourth display panels 101, 102, 103, and 104 may be defined as a first width a1, and a distance between two sub-pixel regions, which are adjacent in the second direction D2, among the first to third sub-pixel region 31, 32, and 33 may be defined as a second width a2. A width of two of the peripheral regions 20, which are adjacent in the first direction D1, among the peripheral regions 20 in adjacent display panels among in the first, second, third, and fourth display panels 101, 102, 103, and 104 may be defined as a third width a3, and a width of two of the peripheral regions 20, which are adjacent in the second direction D2, among the peripheral regions 20 in the adjacent display panels may be defined as a fourth width a4. In embodiments, the first width a1, the second width a2, the third width a3, and the fourth width a4 may be the same.

Figure 9:
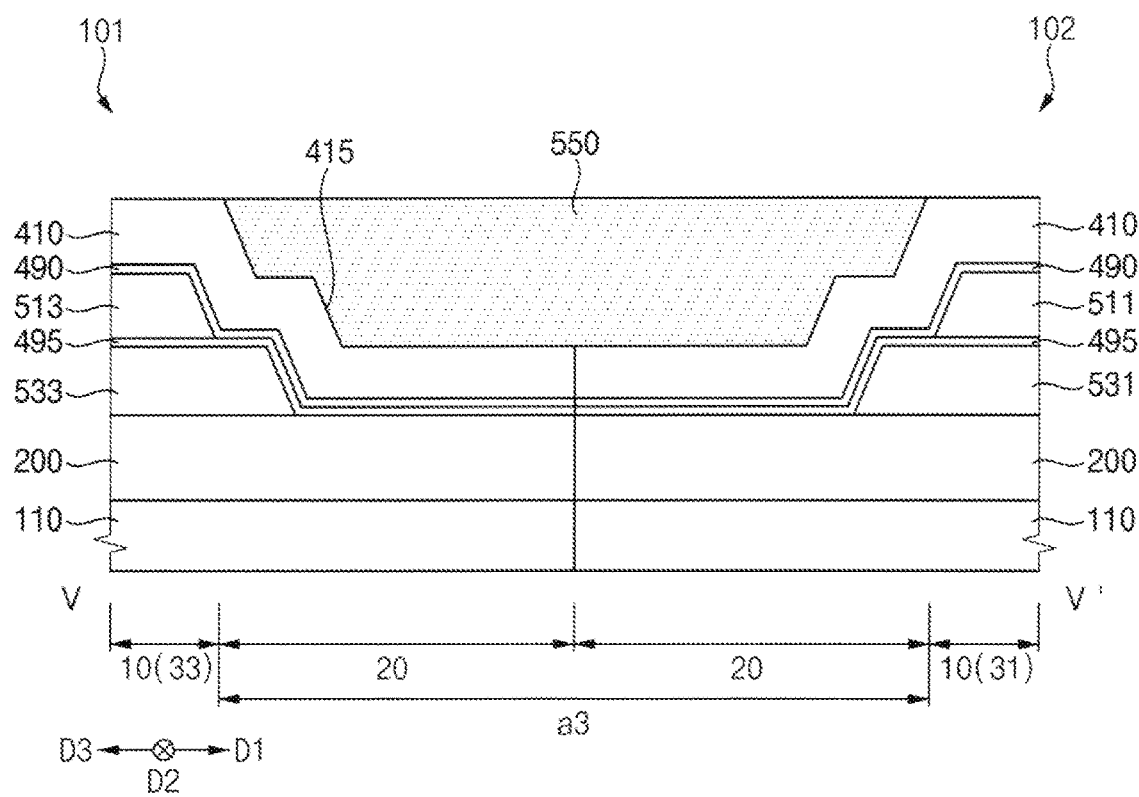
FIG. 9 is a cross-sectional view taken along line V-V' of FIG. 8A.
Figure 10:
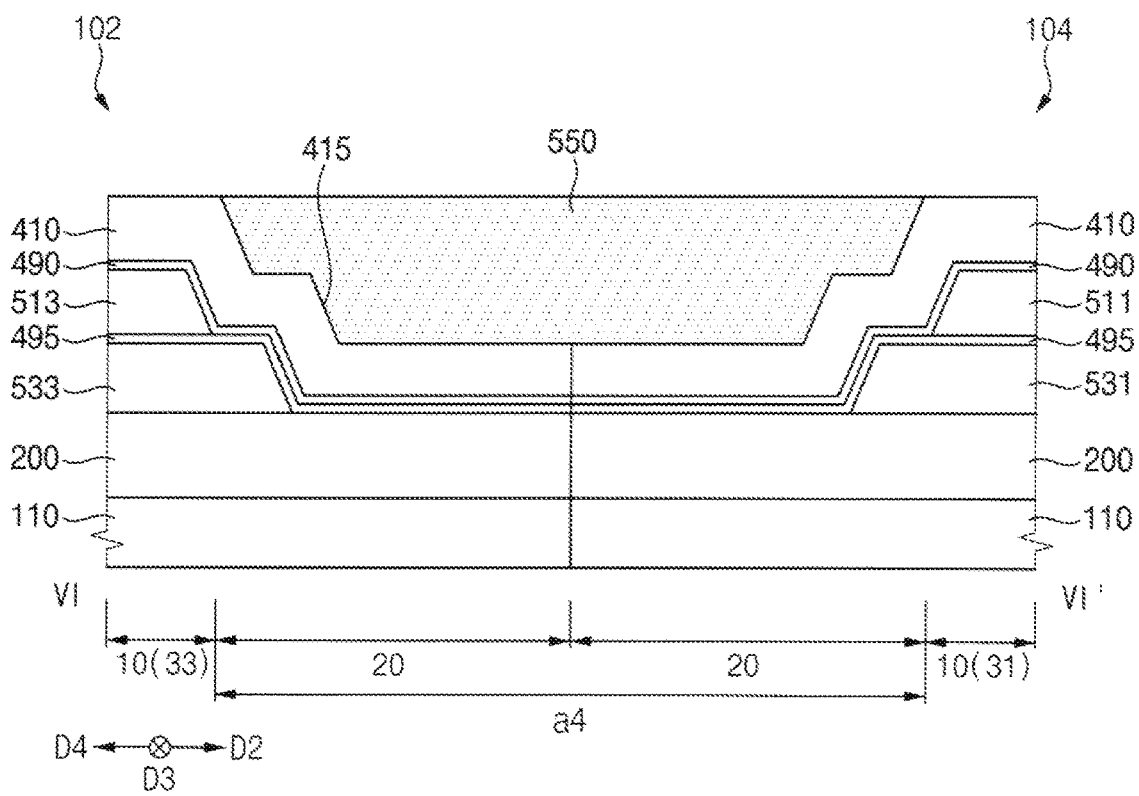
FIG. 10 is a cross-sectional view taken along line VI-VI' of FIG. 8A.

Each of the first, second, third, and fourth display panels 101, 102, 103, and 104 may further include first to third sub-pixels (e.g., a sub-pixel structure 200 of FIGS. 9 and 10). The first to third sub-pixels may be disposed in the first to third sub-pixel regions 31, 32, and 33, respectively. In an embodiment, for example, each of the first to third sub-pixels may emit a light of a blue color. The display device 100 may display an image through the first to third sub-pixels.

Each of the first, second, third, and fourth display panels 101, 102, 103, and 104 may further include a light shielding member 430 illustrated in FIG. 1B. In each of the first, second, third, and fourth display panels 101, 102, 103, and 104, the light shielding member 430 may be disposed in the display region 10, and may not be disposed in the peripheral region 20. That is, an edge of the light shielding member 430 may correspond to an edge of the display region 10. In addition, the light shielding member 430 may include first, second, and third openings 431, 432, and 433 overlapping the first, second, and third sub-pixel regions 31, 32, and 33, respectively. In other words, the light shielding member 430 may be disposed only in the display region 10 except for the first, second, and third sub-pixel regions 31, 32, and 33. Accordingly, as illustrated in FIG. 8B, at least one side of each of openings, which are located at the outer portion of the light shielding member 430, among the first, second, and third openings 431, 432, and 433 of the light shielding member 430 may be open in a direction towards the peripheral region 20.

In embodiments, a width of the light shielding member 430 located between two openings, which are adjacent in the first direction D1, among the first to third openings 431, 432, and 433 may correspond to the first width a1, and a width of the light shielding member 430 located between two openings, which are adjacent in the second direction D2, among the first to third openings 431, 432, and 433 may correspond to the second width a2. As described above, the first width a1 and the second width a2 may be the same.

FIG. 9 is a cross-sectional view taken along line V-V' of FIG. 8A, and FIG. 10 is a cross-sectional view taken along line VI-VI' of FIG. 8A. A display device 700 illustrated in FIGS. 9 and 10 may have a configuration substantially the same as or similar to the display device 100 described with reference to FIGS. 4 to 7, except for a shape of a light shielding member 430. In FIGS. 9 and 10, duplicate descriptions for components substantially the same as or similar to the components described with reference to FIGS. 4 to 7 will be omitted.

Referring to FIGS. 4, 6, 8B, 9, and 10, a display device 700 may include first, second, third, and fourth display panels 101, 102, 103, and 104, an optical member 550, and the like. Here, each of the first, second, third, and fourth display panels 101, 102, 103, and 104 may include a substrate 110, a sub-pixel structure 200, a light shielding member 430, optical filters 530, a first capping layer 495, color filters 510, a second capping layer 490, a cover member 410, and the like. The substrate 110, the light shielding member 430 and the cover member 410 which are included in the first display panel 101 are defined as a first substrate, a first light shielding member and a first cover member, and the substrate 110, the light shielding member 430 and the cover member 410 which are included in the second display panel 102 are defined as a second substrate, a second light shielding member and a second cover member. In addition, the substrate 110, the light shielding member 430 and the cover member 410 which are included in the third display panel 103 are defined as a third substrate, a third light shielding member and a third cover member, and the substrate 110, the light shielding member 430 and the cover member 410 which are included in the fourth display panel 104 are defined as a fourth substrate, a fourth light shielding member and a fourth cover member.

The light shielding member 430 may be disposed only in the display region 10 except for the first, second, and third sub-pixel regions 31, 32, and 33 on the first capping layer 495, and may not be disposed in the peripheral region 20 on the first capping layer 495. In other words, the light shielding member 430 may include the first to third openings 431, 432, and 433, and the first to third openings 431, 432, and 433 may overlap the first, second, and third sub-pixel regions 31, 32, and 33, respectively.

The cover member 410 may be disposed in the display region 10 and the peripheral region 20 on the second capping layer 490. In other words, the cover member 410 (e.g., the first, second, third, and fourth cover members) may be disposed on an entirety of the substrate 110 (e.g., the first, second, third, and fourth substrates). In embodiments, the cover member 410 may be disposed along a profile of the second capping layer 490.

In embodiments, as illustrated in FIG. 9, a groove 415 defined by both the cover member 410 of the first display panel 101 and the cover member 410 of the second display panel 102 may be formed on a boundary of the first and second display panels 101 and 102. In an embodiment, for example, since the light shielding member 430, the optical filters 530 and the color filters 510 are not disposed in the peripheral region 20 adjacent to the boundary (e.g., are spaced apart from the boundary in a direction along the sub-pixel structure 200), a step may occur. Due to the step, the groove 415 may be defined by the first cover member and the second cover member. Similarly, as illustrated in FIG. 10, the groove 415 defined by both the cover member 410 of the second display panel 102 and the cover member 410 of the fourth display panel 104 may be formed on a boundary of the second and fourth display panels 102 and 104. For example, since the light shielding member 430, the optical filters 530, and the color filters 510 are not disposed in the peripheral region 20 adjacent to the boundary, a step may occur. Due to the step, the groove 415 may be defined by the second cover member and the fourth cover member. In embodiments, a width of the groove 415 along the first direction D1 may be equal to a third width a3 or a fourth width a4, respectively.

The optical member 550 may be disposed in the groove 415 of the cover member 410 in the peripheral region 20. As illustrated in FIGS. 9 and 10, the optical member 550 may fill the groove 415 in both the peripheral regions 20 adjacent to the boundary of the first and second display panels 101 and 102 and the peripheral regions 20 adjacent to the boundary of the second and fourth display panels 102 and 104. Similarly, the optical member 550 may fill the groove 415 in both the peripheral regions 20 adjacent to the boundary of the first and third display panels 101 and 103 and the peripheral regions 20 adjacent to the boundary of the third and fourth display panels 103 and 104. That is, the optical member 550 may have a cross shape in a plan view of the display device 700. In other words, the optical member 550 may be disposed at the respective boundaries between the first, second, third, and fourth display panels 101, 102, 103, and 104. In embodiments, the optical member 550 may include a black ink. Alternatively, the optical member 550 may contain the same material as the light shielding member 430 in the display region 10.

Accordingly, the display device 700 including the first display panel 101, the second display panel 102, the third display panel 103, the fourth display panel 104, and the optical member 550 may be provided.

In embodiments, the optical member 550 may be disposed in the peripheral regions 20 adjacent to the respective boundaries of the first, second, third, and fourth display panels 101, 102, 103, and 104. In this case, a width of the light shielding member 430 disposed in the display region 10 may be the same as a width (e.g., the third width a3 or the fourth width a4) of a light blocking pattern (e.g., the optical member 550) disposed in the peripheral regions 20 adjacent to the boundaries.

In one or more embodiment of the display device 700, the first and second widths a1 and a2 of the light shielding member 430 disposed in the display region 10 may be the same as the third and fourth widths a3 and a4 of the optical member 550 disposed in the peripheral regions 20 at the boundaries. Accordingly, when the display device 700 is viewed from outside thereof, unnaturalness of the image at the boundaries may not be perceived.

Figure 11:
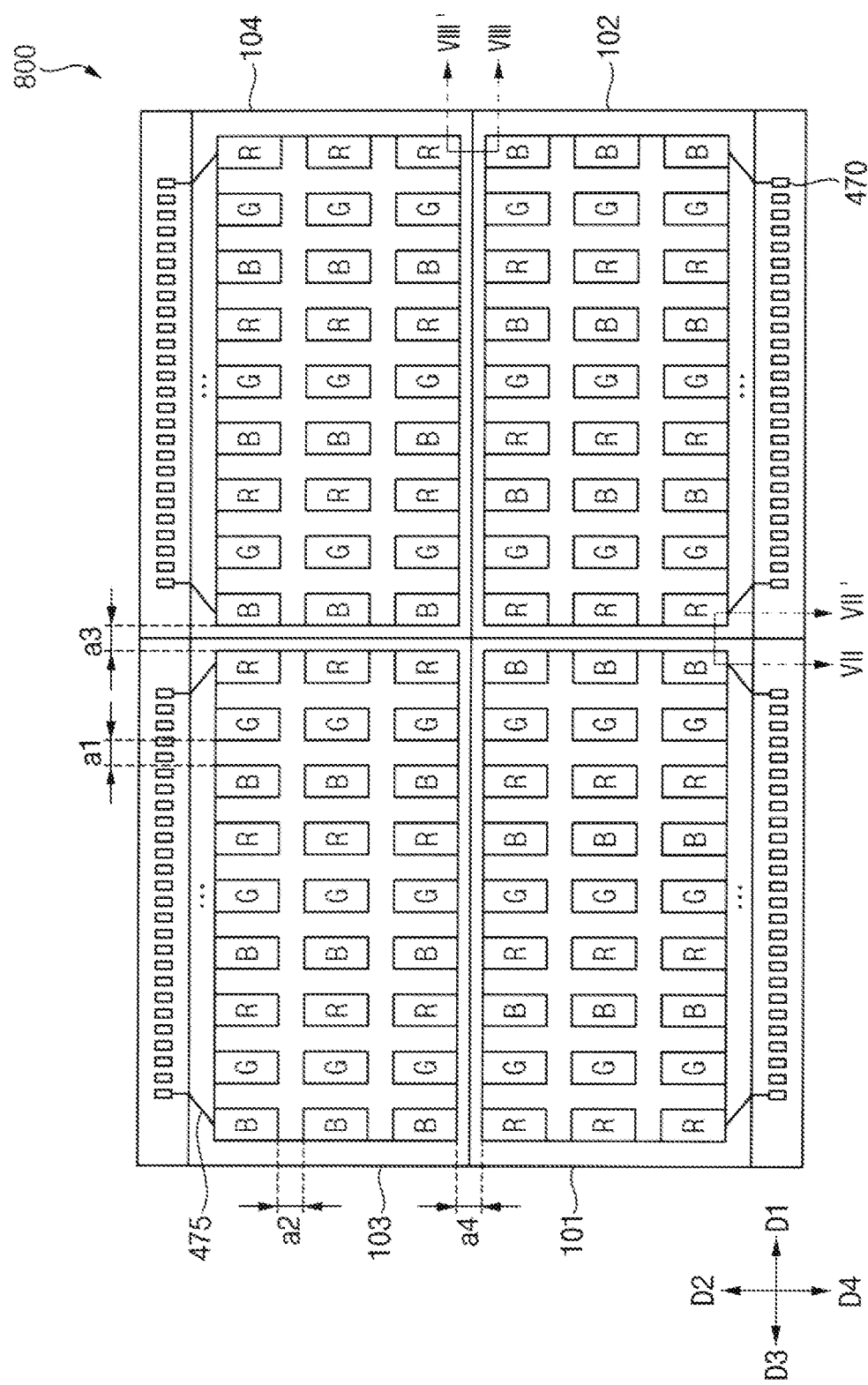
FIG. 11 is a plan view showing an embodiment of a display device.
Figure 12:
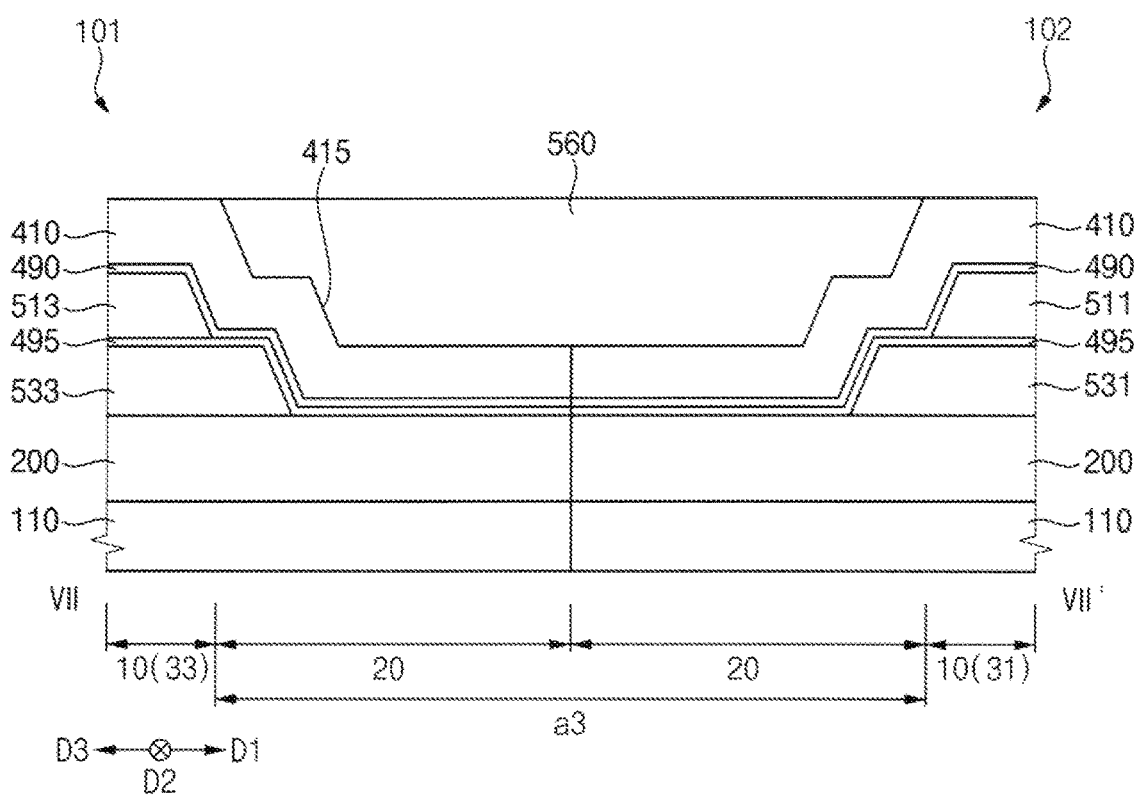
FIG. 12 is a cross-sectional view taken along line VII-VII' of FIG. 11.
Figure 13:
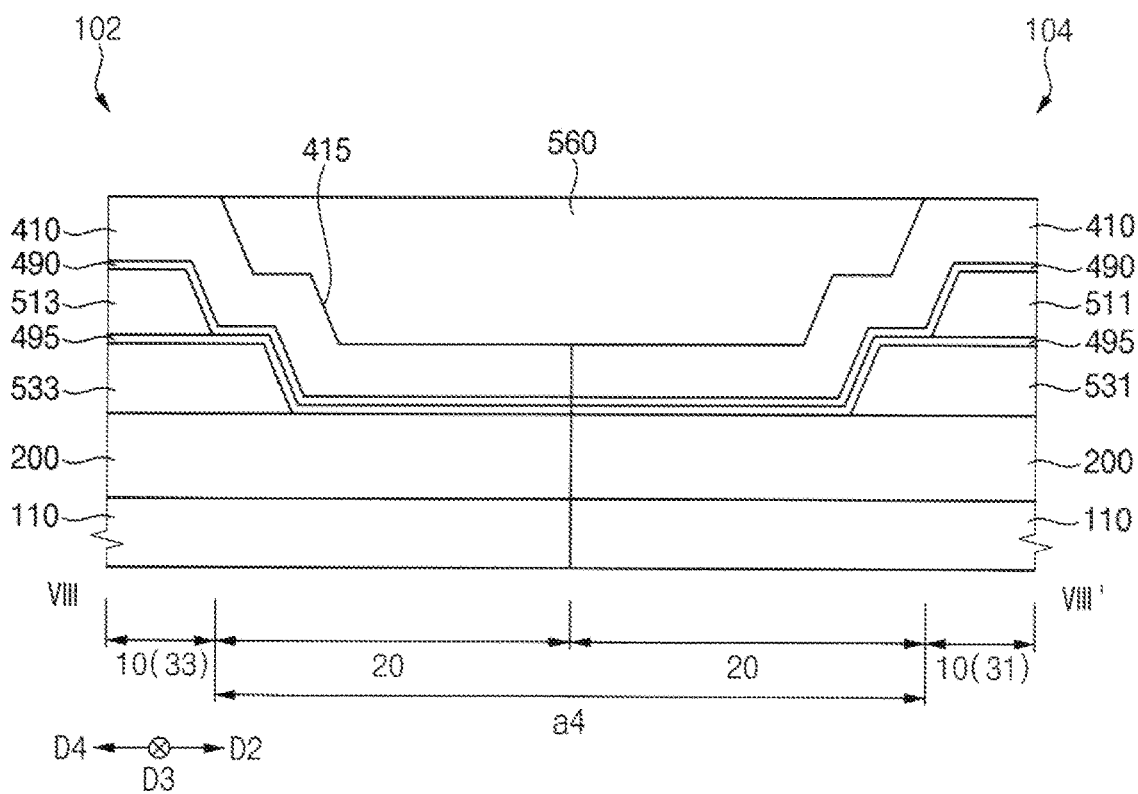
FIG. 13 is a cross-sectional view taken along line VIII-VIII' of FIG. 11.

FIG. 11 is a plan view showing an embodiment of a display device 800, and FIG. 12 is a cross-sectional view taken along line VII-VII' of FIG. 11. FIG. 13 is a cross-sectional view taken along line VIII-VIII' of FIG. 11. A display device 800 illustrated in FIGS. 11, 12, and 13 may have a configuration substantially the same as or similar to the display device 700 described with reference to FIGS. 8A to 10, except for a shape of an optical member 560. In FIGS. 11, 12, and 13, duplicate descriptions for components substantially the same as or similar to the components described with reference to FIGS. 8A to 10 will be omitted.

Referring to FIGS. 8B, 11, 12, and 13, a display device 800 may include first, second, third, and fourth display panels 101, 102, 103 and 104 and an optical member 560. Here, each of the first, second, third, and fourth display panels 101, 102, 103, and 104 may include a substrate 110, a sub-pixel structure 200, a light shielding member 430, optical filters 530, a first capping layer 495, color filters 510, a second capping layer 490, a cover member 410, and the like. In addition, the optical filters 530 may include a first optical filter 531, a second optical filter 532, and a third optical filter 533, and the color filters 510 may include a first color filter 511, a second color filter 512, and a third color filter 513.

The light shielding member 430 (refer to FIG. 8B) may be disposed only in the display region 10 except for the first, second, and third sub-pixel regions 31, 32, and 33 on the first capping layer 495, and may not be disposed in the peripheral region 20 on the first capping layer 495. In other words, the light shielding member 430 may include the first to third openings 431, 432, and 433, and the first to third openings 431, 432, and 433 may overlap the first, second, and third sub-pixel regions 31, 32, and 33, respectively.

The optical member 560 may be disposed in the groove 415 of the cover member 410 in the peripheral region 20. As illustrated in FIGS. 12 and 13, the optical member 560 may fill the groove 415 in both the peripheral regions 20 adjacent to the boundary of the first and second display panels 101 and 102 and the peripheral regions 20 adjacent to the boundary of the second and fourth display panels 102 and 104. Similarly, the optical member 560 may fill the groove 415 in both the peripheral regions 20 adjacent to the boundary of the first and third display panels 101 and 103 and the peripheral regions 20 adjacent to the boundary of the third and fourth display panels 103 and 104. That is, the optical member 560 may have a cross shape in a plan view of the display device 800. In other words, the optical member 560 may be disposed on the boundaries respectively between the first, second, third, and fourth display panels 101, 102, 103, and 104. In embodiments, the optical member 560 may contain the same material as the third optical filter 533. In an embodiment, for example, a scattering ink including TiO, ZrO, AlO$_3$, In$_2$O$_3$, ZnO, SnO$_2$, Sb$_2$O$_3$, ITO, etc. may be filled in the groove 415 through an inking process.

Accordingly, the display device 800 including the first display panel 101, the second display panel 102, the third display panel 103, the fourth display panel 104, and the optical member 560 may be provided.

In embodiments, the optical member 560 may be disposed in peripheral regions 20 adjacent to the boundaries of the first, second, third, and fourth display panels 101, 102, 103, and 104. In this case, signal wires 475 and the like may not be disposed in the peripheral regions 20 adjacent to the boundaries. In an embodiment, for example, the signal wires 475 may extend in a direction from the pad region 60 to the display region 10, and may not be disposed in portions of the peripheral region 20 surrounding the display region 10 except for the portion of the peripheral region 20 adjacent to the pad region 60. In addition, a gate driver and a data driver may not be disposed in the peripheral region 20 surrounding the display region 10. In an embodiment, for example, the gate driver and the data driver may include a flexible printed circuit board ("FPCB"), a printed circuit board ("PCB"), and a flexible flat cable ("FFC"), etc. that are electrically connected to the pad electrode 470 at the pad region 60.

In one or more embodiment of the display device 800, the optical member 560 disposed in the peripheral regions 20 adjacent to the boundaries includes a transparent material or a light-transmitting material, and the signal wires 475, the gate driver and the data driver, etc. are not disposed in the peripheral region 20 surrounding the display region 10 except for the peripheral region 20 adjacent to the pad region 60, such that the peripheral regions 20 adjacent to the boundaries may be transparent. Accordingly, the display device 800 is viewed from outside thereof, unnaturalness of an image at the boundaries may not perceived.

Figure 14:
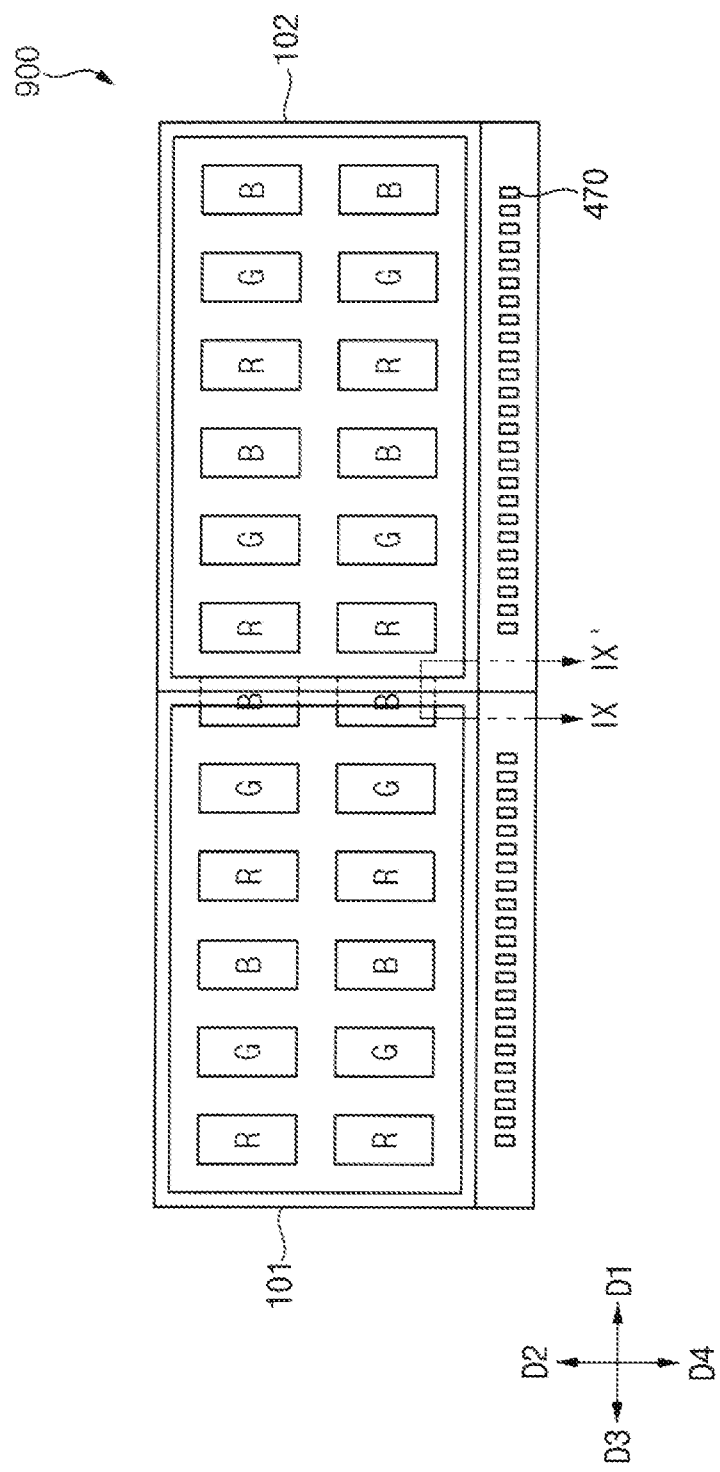
FIG. 14 is a plan view showing an embodiment of a display device.
Figure 15:
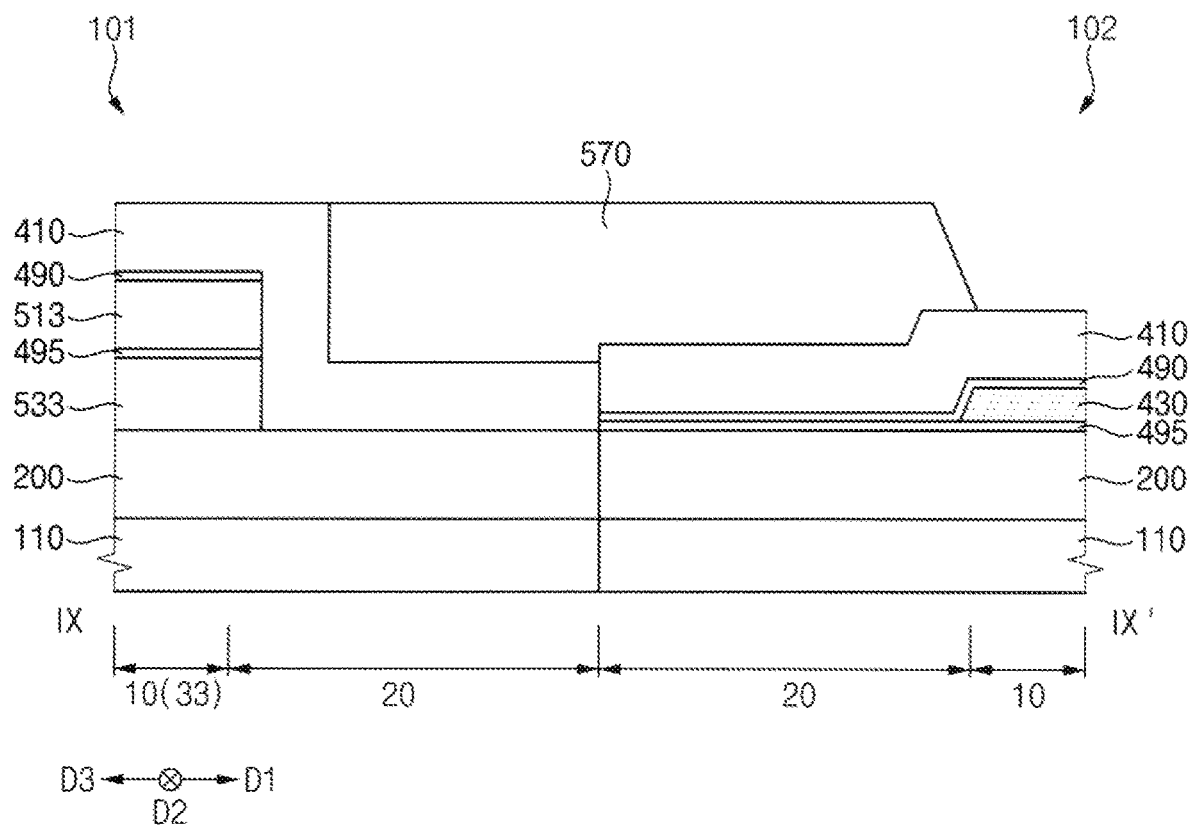
FIG. 15 is a cross-sectional view taken along line IX-IX' of FIG. 14.

FIG. 14 is a plan view showing an embodiment of a display device 900, and FIG. 15 is a cross-sectional view taken along line IX-IX' of FIG. 14. A display device 900 illustrated in FIGS. 14 and 15 may have a configuration substantially the same as or similar to the display device 800 described with reference to FIGS. 11 to 13, except for a shape of a first display panel 101 and a shape of an optical member 570. In FIGS. 14 and 15, duplicate descriptions for components substantially the same as or similar to the components described with reference to FIGS. 11 to 13 will be omitted.

Referring to FIGS. 14 and 15, a display device 900 may include first and second display panels 101 and 102 and an optical member 570. Here, each of the first and second display panels 101 and 102 may include a substrate 110, a sub-pixel structure 200, a light shielding member 430, optical filters 530, a first capping layer 495, color filters 510, a second capping layer 490, a cover member 410, and the like. In addition, the optical filters 530 may include a first optical filter 531, a second optical filter 532, and a third optical filter 533, and the color filters 510 may include a first color filter 511, a second color filter 512, and a third color filter 513.

In the first display panel 101, the third optical filter 533 may be disposed in the third sub-pixel region 33 on the sub-pixel structure 200 and a portion of the display region 10 adjacent to the third sub-pixel region 33 (e.g., non-pixel region of the display region 10). The third optical filter 533 may overlap the third color filter 513, and may be disposed under the third color filter 513. In other words, the third optical filter 533 may be disposed on the third sub-pixel. A light emitted from the third sub-pixel may pass through the third optical filter 533. The third optical filter 533 may transmit a light of a blue color and may not color-convert incident light thereto. In an embodiment, for example, the third optical filter 533 may include scattering materials that emits or transmits a light of a blue color.

In embodiments, as illustrated in FIG. 15, the third optical filter 533 disposed in a third sub-pixel region of the first display panel 101, which is adjacent to the second display panel 102 (e.g., closest to the second display panel 102), among the third sub-pixel regions 33 of the display region 10 of the first display panel 101 may have a shape where a part of the third optical filter 533 is excluded such as being removed. In an embodiment, for example, a first portion width in the first direction D1 of the third optical filter 533 disposed in the third sub-pixel region of the first display panel 101 adjacent to the second display panel 102 may be different from a second portion width of the third optical filter 533 which extends from the first portion width and into the peripheral area 20. In an embodiment, for example, a width of the first portion width may be less than a width of the second portion width. The third optical filter 533 may be spaced apart from the optical member 570 in a direction along the substrate 110.

The third optical filter 533 may include TiO, ZrO, AlO$_3$, In$_2$O$_3$, ZnO, SnO$_2$, Sb$_2$O$_3$, ITO, etc. However, a material of the third optical filter 533 is not limited thereto, and any material that scatters a light of a blue color without converting the light of the blue color may be variously modified.

In the first display panel 101, the first capping layer 495 may be disposed in the display region 10 and the peripheral region 20 on the optical filters 530 and the sub-pixel structure 200. In embodiments, as illustrated in FIG. 15, the first capping layer 495 may not be disposed in the peripheral region 20 of the first display panel 101 adjacent to the second display panel 102 (e.g., may be excluded from the peripheral region 20 and spaced apart from the optical member 570 in a direction along the substrate 110). In other words, the first capping layer 495 may be disposed only on the upper surface of the third optical filter 533 disposed in the third sub-pixel region of the first display panel 101 adjacent to the second display panel 102.

In the first display panel 101, the light shielding member 430 may be disposed only in the display region 10 except for the first, second, and third sub-pixel regions 31, 32, and 33 on the first capping layer 495. The light shielding member 430 may include first to third openings 431, 432, and 433, and the first to third openings 431, 432, and 433 may be disposed in both lateral portion of each of the first to third optical filters 531, 532, and 533 to expose a part of an upper surface of each of the first to third optical filters 531, 532, and 533 to outside the light shielding member 430. In embodiments, as illustrated in FIG. 15, the light shielding member 430 may be disposed only in a left side of third optical filter 533 disposed in a third sub-pixel region 33 of the first display panel 101 adjacent to the second display panel 102.

In the first display panel 101, the third color filter 513 may be disposed in the third sub-pixel region 33 and a part of the display region 10 adjacent to the third sub-pixel region 33 on the first capping layer 495 and a portion of the light shielding member 430.

In embodiments, as illustrated in FIG. 15, the third color filter 513 disposed in a third sub-pixel region 33 of the first display panel 101, which is adjacent to the second display panel 102, among the third sub-pixel regions 33 of the display region 10 of the first display panel 101 may have a shape where a part of the third color filter 513 is excluded or removed. In an embodiment, for example, a first portion width in the first direction D1 of the third color filter 513 disposed in the third sub-pixel region 33 of the first display panel 101 adjacent to the second display panel 102 may be different from a second portion width of the third color filter 513. In an embodiment, for example, a width of the first portion width may be less than a width of the second portion width in a direction along the substrate 110.

In the first display panel 101, the second capping layer 490 may be disposed in the display region 10 and the peripheral region 20 on the color filters 510, the light shielding member 430, and the first capping layer 495. In embodiments, as illustrated in FIG. 15, the second capping layer 490 may not be disposed in the peripheral region 20 of the first display panel 101 adjacent to the second display panel 102. In other words, the second capping layer 490 may be disposed only on the upper surface of the third color filter 513 disposed in the third sub-pixel region of the first display panel 101 adjacent to the second display panel 102. Sidewalls of the second capping layer 490, the third color filter 513, the first capping layer 495, and the third optical filter 533 may be aligned or coplanar with each other.

In the first display panel 101, the cover member 410 may be disposed in the display region 10 and the peripheral region 20 on the second capping layer 490. In other words, the cover member 410 may be disposed on an entirety of the substrate 110. In embodiments, the cover member 410 may be disposed along a profile of the second capping layer 490 in the display region 10. In addition, the cover member 410 may cover a sidewall of the third optical filter 533, a sidewall of the first capping layer 495, a sidewall of the third color filter 513, and a sidewall of the second capping layer 490 in the peripheral region 20 the first display panel adjacent to the second display panel 102, and may be disposed on the sub-pixel structure 200. The cover member 410 may contact the sub-pixel structure 200 such as to form an interface therebetween. As each of the third optical filter 533, the first capping layer 495, the third color filter 513, and the second capping layer 490 is not disposed in the peripheral region 20 of the first display panel 101 adjacent to the second display panel 102, a step may be formed in the cover member 410.

The optical member 570 may be disposed along the step. The optical member 570 may fill the step, and may be disposed on the cover member 410 disposed in the peripheral region 20 of the second display panel 102 adjacent to the first display panel 101. In embodiments, the optical member 570 may contain the same material as the third optical filter 533. Accordingly, even if a width of the third optical filter 533 disposed in the third sub-pixel region of the first display panel 101 adjacent to the second display panel 102 is relatively small, the optical member 570 may assist the third optical filter 533. That is, the third sub-pixel region of the first display panel 101 adjacent to the second display panel 102 may be located to overlap the peripheral regions 20 adjacent to the boundary of the first display panel 101 and the second display panel 102.

In one or more embodiment of the display device 900, as the third optical filter 533 disposed in the third sub-pixel region of the first display panel 101 adjacent to the second display panel 102 is extended into the peripheral regions 20 adjacent to the boundary of the first display panel 101 and the second display panel 102 to define an extended portion of the third optical filter 533, when the display device 900 is viewed from outside thereof, unnaturalness of an image at the boundaries may not be perceived.

Figure 16:
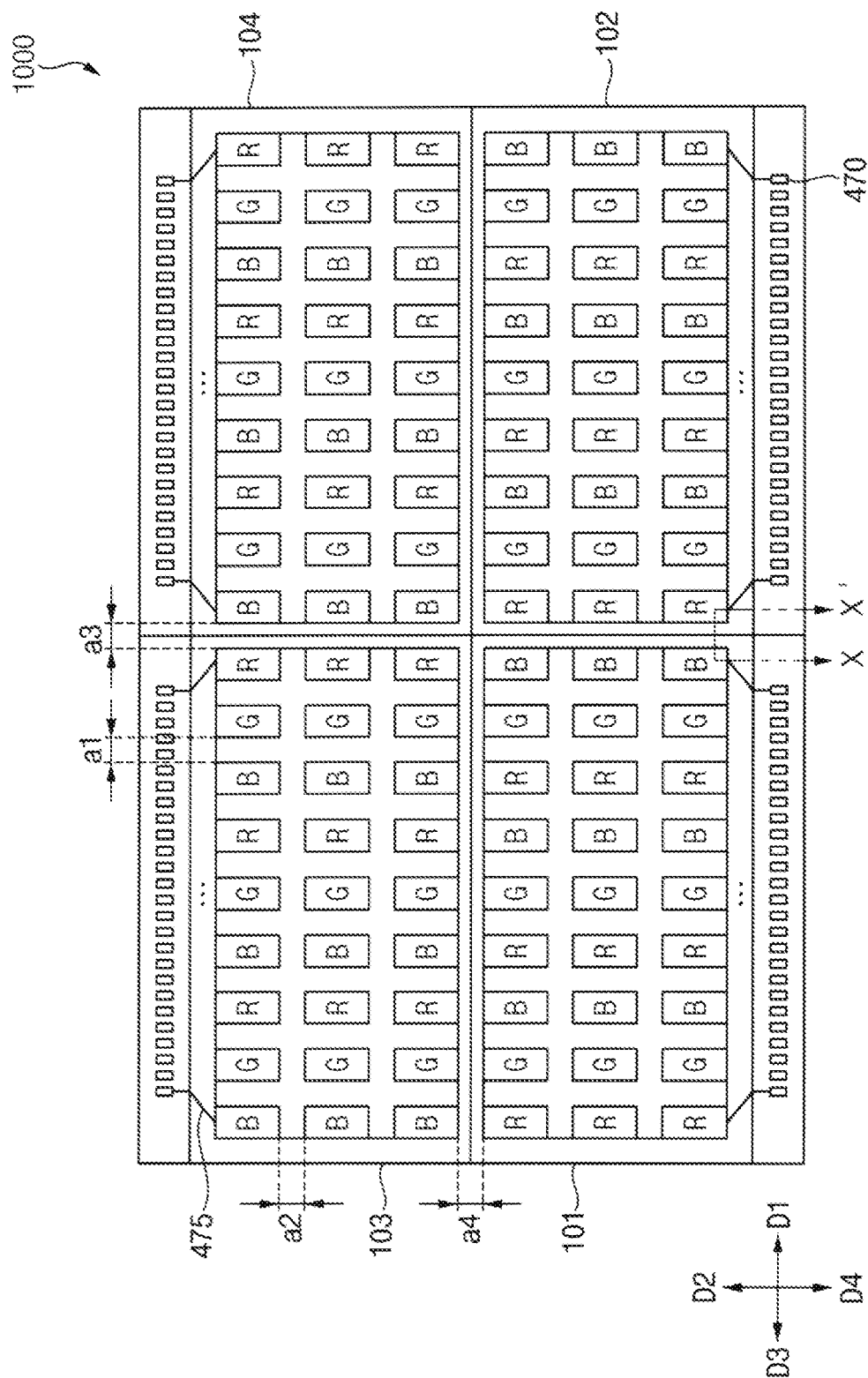
FIG. 16 is a plan view showing an embodiment of a display device.
Figure 17:
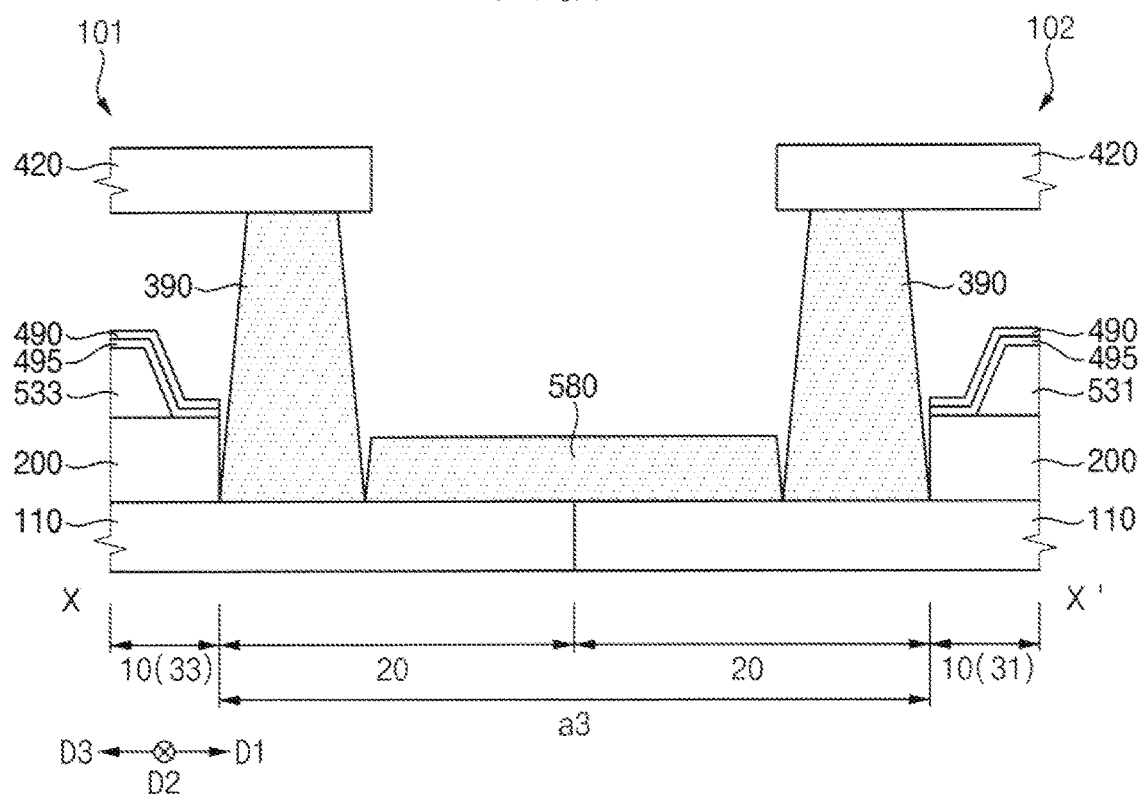
FIG. 17 is a cross-sectional view taken along line X-X' of FIG. 16.

FIG. 16 is a plan view showing an embodiment of a display device 1000, and FIG. 17 is a cross-sectional view taken along line X-X' of FIG. 16. A display device 1000 illustrated in FIGS. 16 and 17 may have a configuration substantially the same as or similar to the display device 700 described with reference to FIGS. 8A to 10, except for an optical member 580, a sealing member 390, and an encapsulation substrate 420. In FIGS. 16 and 17, duplicate descriptions for components substantially the same as or similar to the components described with reference to FIGS. 8A to 10 will be omitted.

Referring to FIGS. 8B, 16, and 17, a display device 1000 may include first, second, third, and fourth display panels 101, 102, 103, and 104, an optical member 580, and the like. Here, each of the first, second, third, and fourth display panels 101, 102, 103, and 104 may include a substrate 110, a sub-pixel structure 200, a light shielding member 430, optical filters 530, a first capping layer 495, color filters 510, a second capping layer 490, a sealing member 390, an encapsulation substrate 420, and the like.

The sealing member 390 provided in plural including a plurality of sealing members 390 may be disposed between the substrate 110 and the encapsulation substrate 420. In an embodiment, for example, the sealing member 390 may substantially surround the display region 10. In addition, the sealing member 390 may be in contact with a lower surface of the encapsulation substrate 420 and an upper surface of the substrate 110 in the peripheral region 20. The sealing member 390 may include non-conductive materials. In an embodiment, for example, the sealing member 390 may include a frit, etc. In addition, the sealing member 390 may additionally include a photo curable material. In an embodiment, for example, the sealing member 390 may include a compound such as the organic material and the photo curable material. In addition, after ultraviolet ray, laser beam, visible ray, etc. are irradiated in the compound, the compound may be cured, and thus the sealing member 390 may be obtained. The photo curable material included in the sealing member 390 may include epoxy acrylate-based resin, polyester acrylate-based resin, urethane acrylate based-resin, polybutadiene acrylate-based resin, silicon acrylate-based resin, alkyl acrylate-based resin, etc.

In an embodiment, for example, a laser may be irradiated in the compound such as the organic material and the photo curable material. According to an irradiation of the light of the laser, a state of the compound may be changed from a solid state to a liquid state. In addition, the compound of the liquid state may be cured to the solid state after a predetermined time. In accordance with the state change of the compound, the compound may couple the substrate 110 and the encapsulation substrate 420 to each other.

In embodiments, the sealing member 390 may be substantially opaque. In an embodiment, for example, the sealing member 390 may further include light shielding materials to absorb light. The light shielding materials may include carbon black, titanium nitride oxide, titanium black, phenylene black, aniline black, cyanine black, nigrosine acid black, black resin, and the like.

The optical member 580 may be disposed in the peripheral regions 20 adjacent to the boundaries of the first, second, third, and fourth display panels 101, 102, 103, and 104 on the substrate 110. In embodiments, the optical member 580 may include a black ink. In an embodiment, for example, the black ink may be filled between the sealing members 390 in peripheral regions 20 adjacent to the boundaries through an inking process. Alternatively, the optical member 580 may contain the same material as the light shielding member 430.

The encapsulation substrate 420 may be disposed on the sealing member 390. The encapsulation substrate 420 may be disposed to face the substrate 110 with the sealing member 390 therebetween. The encapsulation substrate 420 and the substrate 110 may include substantially the same material. In an embodiment for example, the encapsulation substrate 420 may include a quartz substrate, a synthetic quartz substrate, a calcium fluoride substrate, a fluorine-doped quartz substrate, a soda lime glass substrate, an alkali-free glass substrate, and the like.

In embodiments, the sealing member 390 and the optical member 580 may be disposed in the peripheral regions 20 adjacent to the respective boundaries between the first, second, third, and fourth display panels 101, 102, 103, and 104. In this case, a width of the light shielding member 430 disposed in the display region 10 and a total width (e.g., a third width a3 or a fourth width a4) of the sealing member 390 and the optical member 580 disposed in the peripheral regions 20 adjacent to the boundaries may be the same.

In one or more embodiment of the display device 1000, the first and second widths a1 and a2 of the light shielding member 430 disposed in the display region 10 may be the same as the third and fourth widths a3 and a4 as total widths of the sealing member 390 and the optical member 580 which are disposed together in the peripheral regions 20 adjacent to the respective boundaries. Accordingly, when the display device 1000 is viewed from outside thereof, unnaturalness of an image at the boundaries may not be visually perceived.

Figure 18:
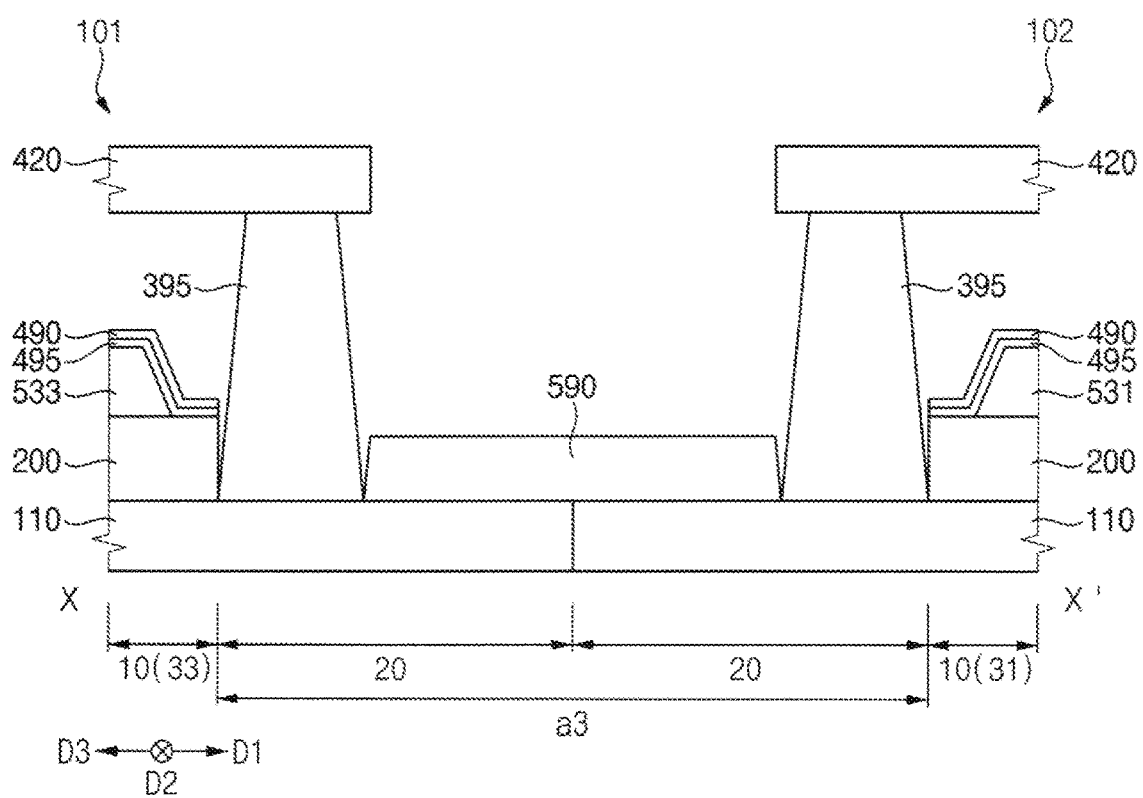
FIG. 18 is a cross-sectional view showing an embodiment of a display device.

FIG. 18 is a cross-sectional view showing an embodiment of a display device 1000. A display device 1000 illustrated in FIG. 18 may have a configuration substantially the same as or similar to the display device 700 described with reference to FIGS. 16 and 17, except for an optical member 590 and a sealing member 395. In FIG. 18, duplicate descriptions for components substantially the same as or similar to the components described with reference to FIGS. 16 and 17 will be omitted.

Referring to FIGS. 8B and 18, a display device 1000 may include first, second, third, and fourth display panels 101, 102, 103, and 104, an optical member 590, and the like. Here, each of the first, second, third, and fourth display panels 101, 102, 103, and 104 may include a substrate 110, a sub-pixel structure 200, a light shielding member 430, optical filters 530, a first capping layer 495, color filters 510, a second capping layer 490, a sealing member 395, an encapsulation substrate 420, and the like.

The sealing member 395 provided in plural including a plurality of sealing members 395 may be disposed between the substrate 110 and the encapsulation substrate 420. In an embodiment, for example, the sealing member 395 may substantially surround the display region 10. In addition, the sealing member 395 may be in contact with a lower surface of the encapsulation substrate 420 and an upper surface of the substrate 110 in the peripheral region 20. In embodiments, the sealing member 395 may be substantially transparent. In an embodiment, for example, the sealing member 395 may contain the same material as the third optical filter 533.

The optical member 590 may be disposed in the peripheral regions 20 adjacent to boundaries of the first, second, third, and fourth display panels 101, 102, 103, and 104 on the substrate 110. In embodiments, the optical member 590 may contain the same material as the third optical filter 533. In an embodiment, for example, a scattering ink including TiO, ZrO, $AlO_3$, $In_2O_3$, ZnO, $SnO_2$, $Sb_2O_3$, ITO, etc. is filled between the sealing members 395 in the peripheral regions 20 adjacent to the boundaries through an inking process.

In one or more embodiment of the display device 1000, the sealing member 395 and the optical member 590 disposed in the peripheral regions 20 adjacent to the boundaries are made of a transparent material and signal lines 475, a gate driver, a data driver, and the like is not disposed in the peripheral region 20 surrounding a display region 10 except for the peripheral region 20 adjacent to the pad region 60, such that the peripheral regions 20 adjacent to the boundaries may be transparent. Accordingly, when the display device 1000 is viewed from outside thereof, unnaturalness of an image at the boundaries may not be visually perceived.

One or more embodiment of the invention may be applied to various electric devices including a display device 100. Embodiments of the invention may be applied to a number of display devices such as vehicle-display devices, ship-display devices, aircraft-display devices, portable communication devices, display devices for an exhibition, display devices for an information transfer, medical-display devices, etc.

The foregoing is illustrative of embodiments and is not to be construed as limiting thereof. Although embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
    a substrate layer including a plurality of substrates;
    a first display panel including a first substrate of the substrate layer and a first cover member which faces the first substrate;
    a second display panel which is adjacent to the first display panel and coupled to the first display panel, the second display panel including a second substrate of the substrate layer and a second cover member which faces the second substrate;
    a first boundary between the first display panel and the second display panel;

the first cover member and the second cover member adjacent to each other at the first boundary and together defining a first groove at the first boundary; and
an optical member in the first groove at the first boundary.

2. The display device of claim 1, wherein
the first display panel further includes a first light shielding member between the first cover member and the first substrate,
the second display panel further includes a second light shielding member between the second cover member and the second substrate, and
each of the first light shielding member and the second light shielding member defines a plurality of light emitting openings of the display device which are adjacent to the first groove.

3. The display device of claim 2, wherein
each of the first display panel and the second display panel includes a display region including the plurality of light emitting openings and a peripheral region which is adjacent to the display region, and
the first boundary is between the peripheral region of the first display panel and the peripheral region of the second display panel.

4. The display device of claim 3, wherein the optical member which is in the first groove is in both the peripheral region of the first display panel and the peripheral region of the second display panel.

5. The display device of claim 3, wherein
the first light shielding member is in the display region of the first display panel and is excluded from the peripheral region thereof, and
the second light shielding member is in the display region of the second display panel and is excluded from the peripheral region thereof.

6. The display device of claim 3, wherein
the second display panel is adjacent to the first display panel along a first direction,
at the display region, each of the first light shielding member and the second light shielding member has a width along the first direction which is between adjacent light emitting openings among the plurality of light emitting openings,
the optical member which is in the first groove has a width along the first direction, and
the width of each of the first light shielding member and the second light shielding member is equal to the width of the optical member.

7. The display device of claim 3, wherein
the second display panel is adjacent to the first display panel along a first direction,
at the display region, each of the first light shielding member and the second light shielding member has a width along the first direction which is between adjacent light emitting openings among the plurality of light emitting openings,
the peripheral region of each of the first display panel and the second display panel has a width along the first direction, and
the width of each of the first light shielding member and the second light shielding member is twice the width of the peripheral region of each of the first display panel and the second display panel.

8. The display device of claim 3, wherein
the first light shielding member of the first display panel is in the display region and the peripheral region thereof, and
the second light shielding member of the second display panel is in the display region and the peripheral region thereof.

9. The display device of claim 8, wherein the optical member which is in the first groove, the first light shielding member of the first display panel and the second light shielding member of the second display panel include the same material.

10. The display device of claim 2, wherein each of the first display panel and the second display panel further includes in order from the first substrate and the second substrate, respectively:
a plurality of optical filters; and
a plurality of color filters respectively on the plurality of optical filters.

11. The display device of claim 10, wherein each of the first display panel and the second display panel further includes the plurality of color filters respectively corresponding to the plurality of light emitting openings.

12. The display device of claim 10, wherein the plurality of optical filters includes:
a first optical filter which converts a light of a first color to a light of a second color,
a second optical filter which converts the light of the first color to a light of a third color, and
a third optical filter which transmits the light of the first color.

13. The display device of claim 12, wherein each of the first display panel and the second display panel further includes in order from the first substrate and the second substrate, respectively:
a sub-pixel structure which is emits the light of the first color, and
an optical filter layer including each of the first to third optical filters.

14. The display device of claim 12, wherein the optical member and the third optical filter include a same material as each other.

15. The display device of claim 10, wherein
within each of the first display panel and the second display panel, closest optical filters which are closest to the first boundary among the plurality of optical filters and closest color filters respectively corresponding to the closest optical filters among the plurality of color filters respectively define a profile extended toward the first boundary, and
the first cover member and the second cover member respectively extends along the profile which is defined by the closest optical filters and the closest color filters.

16. The display device of claim 15, wherein the closest optical filters overlap the optical member in the first groove.

17. The display device of claim 15, wherein the closest optical filters are further from the first boundary than the optical member.

18. The display device of claim 1, further comprising a third display panel which is adjacent to the first display panel and coupled to the first display panel, the third display panel including a third substrate of the substrate layer and a third cover member which faces the third substrate,
wherein
the second display panel is adjacent to the first display panel along a first direction, and
the third display panel is adjacent to the first display panel along a second direction crossing the first direction.

19. The display device of claim 18, further comprising:
a second boundary between the first display panel and the third display panel;

the first cover member and the third cover member adjacent to each other at the second boundary and together defining a second groove at the second boundary; and wherein the optical member is further in the second groove at the second boundary.

20. The display device of claim 19, further comprising:
a fourth display panel including a fourth substrate of the substrate layer and a fourth cover member which faces the fourth substrate, the fourth display panel being adjacent to the third display panel along the first direction and coupled to the third display panel and adjacent to the second display panel along the second direction and coupled to the second display panel;
a third boundary between the fourth display panel and the third display panel;
a fourth boundary between the fourth display panel and the second display panel;
the fourth cover member and the third cover member adjacent to each other at the third boundary and together defining a third groove at the third boundary; and
the fourth cover member and the second cover member adjacent to each other at the fourth boundary and together defining a fourth groove at the fourth boundary,
wherein the optical member is further in the third groove at the third boundary and the fourth groove at the fourth boundary.

21. The display device of claim 20, wherein
each of the first display panel, the second display panel, the third display panel and the fourth display panel includes a display region including a plurality of light emitting openings having an arrangement, and
the arrangement of the plurality of light emitting openings of the first display panel and the second display panel is the arrangement of the plurality of the light emitting openings of the third display panel and the fourth display panel rotated 180 degrees.

22. The display device of claim 20, wherein the optical member has a cross shape.

23. The display device of claim 1, wherein the first substrate includes a display region and a peripheral region which is adjacent to the display region.

24. The display device of claim 23, wherein the first display panel further includes in order from the first substrate to the first cover member:
a first capping layer;
a first light shielding member defining a plurality of light emitting openings in the display region; and
a second capping layer.

25. The display device of claim 24, wherein
in the display region, the first light shielding member is between the first capping layer and the second capping layer, and
in a portion of the peripheral region which is between the display region and the first boundary, the first capping layer is in contact with the second capping layer.

26. The display device of claim 23, wherein the first substrate further includes a pad region which is adjacent to the peripheral region and through which an electrical signal is provided to the first display panel.

27. The display device of claim 26, wherein the first display panel further includes on the first substrate:
a sub-pixel structure which is in the display region and emits light;
a pad electrode in the pad region; and
a signal wire electrically connecting the pad electrode and the sub-pixel structure to each other.

28. The display device of claim 27, wherein
the signal wire is excluded from a portion of the peripheral region which is between the display region and the first boundary, and
the optical member which is in the first groove is transparent.

* * * * *